(12) United States Patent
Suenaga et al.

(10) Patent No.: US 8,581,477 B2
(45) Date of Patent: Nov. 12, 2013

(54) PIEZOELECTRIC FILM ELEMENT USING (NA,K,LI)NBO3

(75) Inventors: Kazufumi Suenaga, Tsuchiura (JP); Kenji Shibata, Tsukuba (JP); Kazutoshi Watanabe, Tsuchiura (JP); Akira Nomoto, Kasumigaura (JP)

(73) Assignee: Hitachi Cable, Ltd., Tokyo (JP)

( * ) Notice: Subject to any disclaimer, the term of this patent is extended or adjusted under 35 U.S.C. 154(b) by 493 days.

(21) Appl. No.: 13/018,693

(22) Filed: Feb. 1, 2011

(65) Prior Publication Data
US 2011/0187237 A1   Aug. 4, 2011

(30) Foreign Application Priority Data

Feb. 2, 2010  (JP) .................. 2010-020922

(51) Int. Cl.
*H01L 41/047* (2006.01)
*H01L 41/187* (2006.01)

(52) U.S. Cl.
CPC .......... *H01L 41/187* (2013.01); *H01L 41/1873* (2013.01)
USPC ................ 310/358; 252/62.9 R; 252/62.9 PZ

(58) Field of Classification Search
CPC .......................... H01L 41/187; H01L 41/1873
USPC ....................... 310/358; 252/62.9 R, 62.9 PZ
See application file for complete search history.

(56) References Cited

U.S. PATENT DOCUMENTS

| | | | |
|---|---|---|---|
| 6,347,862 B1 | 2/2002 | Kanno et al. | |
| 6,510,597 B2 * | 1/2003 | Yoshida et al. | 29/25.35 |
| 7,197,799 B2 * | 4/2007 | Higuchi et al. | 29/25.35 |
| 7,262,544 B2 * | 8/2007 | Aoki et al. | 310/363 |
| 7,287,840 B2 * | 10/2007 | Miyazawa et al. | 347/68 |
| 7,291,959 B2 * | 11/2007 | Miyazawa et al. | 310/358 |
| 7,312,558 B2 * | 12/2007 | Fujii et al. | 310/358 |

(Continued)

FOREIGN PATENT DOCUMENTS

| | | |
|---|---|---|
| JP | 10-286953 | 10/1998 |
| JP | 2007-019302 | 1/2007 |

OTHER PUBLICATIONS

High performance and advanced application technology of piezo-electric material (published by Science & Technology in 2007) supervised by Kiyoshi Nakmura, pp. 150-153, 399-400.

*Primary Examiner* — Jaydi San Martin
(74) *Attorney, Agent, or Firm* — Fleit Gibbons Gutman Bongini & Bianco PL; Marty Fleit; Paul D. Bianco

(57) ABSTRACT

A piezoelectric film element is provided, which is capable of improving piezoelectric properties, having on a substrate at least a lower electrode, a lead-free piezoelectric film, and an upper electrode, wherein at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and a ratio c/a' is set in a range of 0.992 or more and 0.999 or less, which is the ratio of a crystal lattice spacing c in a direction of a normal line to the substrate surface, with respect to a crystal lattice spacing a' whose inclination angle from the substrate surface is in a range of 10° or more and 30° or less.

18 Claims, 12 Drawing Sheets

(56) References Cited

U.S. PATENT DOCUMENTS

| | | | |
|---|---|---|---|
| 7,602,099 B2 * | 10/2009 | Fujimoto et al. | 310/313 A |
| 8,058,779 B2 * | 11/2011 | Suenaga et al. | 310/358 |
| 8,063,543 B2 * | 11/2011 | Shibata et al. | 310/358 |
| 8,310,135 B2 * | 11/2012 | Suenaga et al. | 310/358 |
| 8,310,136 B2 * | 11/2012 | Suenaga et al. | 310/358 |
| 2013/0106242 A1 * | 5/2013 | Shibata et al. | 310/311 |

* cited by examiner

PIEZOELECTRIC FILM ELEMENT USING (NA,K,LI)NBO3

FIELD OF THE INVENTION

The present invention relates to a piezoelectric film element using lithium potassium sodium niobate and a manufacturing method of the same, and a piezoelectric film device.

DESCRIPTION OF THE RELATED ART

A piezoelectric ceramics is processed into various piezoelectric elements according to various purposes, and is widely used as an actuator for generating deformation by applied voltage, and a functional electronic component such as a sensor for generating the voltage from the deformation of the piezoelectric element. A lead-based dielectric material having high piezoelectric properties is generally known as the piezoelectric ceramics utilized for the purpose of usage in the actuator and the sensor. Particularly, $Pb(Zr_{1-x}Ti_x)O_3$-based perovskite ferroelectric material called PZT has been generally known heretofore. Ordinarily, these piezoelectric materials are formed by sintering an oxide made of a piezoelectric material.

Meanwhile, in recent years, development of the piezoelectric substance not containing lead is desired from the consideration of an environment, and development of sodium potassium lithium niobate (general formula: $(Na_xK_yLi_z)NbO_3$ ($0<x<1$, $0<y<1$, $0<z<1$, $x+y+z=1$), etc, has been progressed. The sodium potassium lithium niobate has the piezoelectric properties comparable to PZT, and therefore is expected as a dominant candidate of the lead-free piezoelectric material.

Meanwhile, at present, as downsizing and higher performance of each kind of electronic component is progressed, the downsizing and higher performance are also required in the piezoelectric element. However, in a piezoelectric material manufactured by a manufacturing method typified by a sintering method, being a method performed conventionally, as its thickness becomes thinner, particularly as the thickness becomes closer to the thickness of about 10 μm, this thickness becomes closer to the size of a crystal grain constituting the material, and its influence can not be ignored. This involves a problem that variation and deterioration of the properties is remarkable, and in order to avoid this problem, a forming method of the piezoelectric substance applying a thin film technique in place of the sintering method has been studied in recent years.

In recent years, a PZT piezoelectric film formed by RF sputtering method is put to practical use as an actuator for a head of highly precise high speed ink jet printer or a small-sized and inexpensive gyro sensor (for example, see patent document 1 and non-patent document 1). Further, the piezoelectric film element using a piezoelectric film made of lithium potassium sodium niobate not using lead is also proposed (for example, see patent document 2).

In order to drive these piezoelectric elements, an electric field (voltage) is applied to a piezoelectric film. Therefore, a conductive material called an electrode needs to be disposed at upper/lower sides of the piezoelectric film. Generally, as the electrode such as a piezoelectric film, a high dielectric film, and a ferroelectric film, platinum (called Pt hereafter) that excels in environmental resistance is frequently used. As the other electrode, a single layer made of Ru, Ir, Sn, In, and an oxide of each of them, and a compound of them and an element contained in the piezoelectric film, or a laminate including these layers, is sometimes used.

PATENT DOCUMENT (Patent Document 1)
Japanese Patent Laid Open Publication No. 1998-286953
(Patent document 2)
Japanese Patent Laid Open Publication No. 2007-19302
(Non-Patent Document)
(Non-patent document 1) High performance and advanced application technology of piezoelectric material (published by science& technology in 2007) supervised by Kiyoshi Nakamura As described above, a head for highly precise high speed ink jet printer or a small-sized and inexpensive gyro sensor with low environmental load can be fabricated, by forming a lead-free piezoelectric film as the piezoelectric film. As a specific candidate thereof, basic study on a thinner film of the lithium potassium sodium niobate has been progressed. Further, in order to realize a lower cost in an aspect of application, it is demanded to establish a technique of forming the piezoelectric film on a Si substrate or a glass substrate with good controllability.

However, in a conventional technique, it is difficult to obtain the piezoelectric film element having high piezoelectric properties uniformly, and a production yield of the piezoelectric film element is poor, and also it is difficult to obtain the piezoelectric film device having high reliability. As a result, when an actuator or a sensor is manufactured by using the Si substrate, it is difficult to stably produce a lead-free device having a long service-life and a high piezoelectric constant.

SUMMARY OF THE INVENTION

In order to solve the above-described problem, an object of the present invention is to provide a piezoelectric film element having desired piezoelectric properties uniformly, and a manufacturing method of the piezoelectric film element capable of improving a production yield of the piezoelectric film element, and a piezoelectric film device capable of realizing high reliability.

According to an aspect of the present invention, a piezoelectric film element is provided, having on a substrate at least a lower electrode, a lead-free piezoelectric film, and an upper electrode, wherein at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and a ratio c/a' is set in a range of 0.992 or more and 0.999 or less, which is the ratio of a crystal lattice spacing c in a direction of a normal line to the substrate surface, with respect to a crystal lattice spacing a' whose inclination angle from the substrate surface is in a range of 10° or more and 30° or less.

According to other aspect of the present invention, a piezoelectric film element is provided, having on a substrate at least a lower electrode, a lead-free piezoelectric film, and an upper electrode, wherein at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and an internal stress $\sigma_\phi$ is set in a range of 0.137 GPa or more and 1.104 GPa or less, which is obtained from the ratio c/a' of a crystal lattice spacing c in a direction of a normal line to the substrate surface, with respect to a crystal lattice spacing a' whose inclination angle from the substrate surface is in a range of 10° or more and 30° or less.

According to further another aspect of the present invention, a manufacturing method of a piezoelectric film element is provided, for forming on a substrate at least a lower electrode, a lead-free piezoelectric film, and an upper electrode respectively by sputtering, wherein film formation is performed so that at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and by controlling any one of a film formation temperature of the lower electrode, a film thickness of an electrode film, or a heat treatment temperature after film formation, or two or more of them, a ratio c/a' is set in a range of 0.99 or more and 0.999 or less, which is the ratio of a crystal lattice spacing c in a direction of a normal line to the substrate surface, with respect to a crystal lattice spacing a' whose inclination angle from the substrate surface is in a range of 10° or more and 30° or less.

According to further another aspect of the present invention, a manufacturing method of a piezoelectric film element is provided, for forming on a substrate at least a lower electrode, a lead-free piezoelectric film, and an upper electrode respectively by sputtering, comprising the step of evaluating at least the lower electrode out of the lower electrode and the upper electrode, by measuring a crystal lattice spacing c in a direction of a normal line to the substrate surface, and a crystal lattice spacing a' whose inclination angle from the substrate surface is in a range of larger than 0° and 40° or less.

According to the present invention, the following one effect or more than one effect can be exerted.
(1) Desired piezoelectric properties can be uniformly provided.
(2) In addition, production yield can be improved.
(3) Further, high reliability can be realized.

BRIEF DESCRIPTION OF THE DRAWINGS

FIG. 10 is an explanatory view of the example 2 of the present invention, wherein FIG. 10A is a view of a crystal structure of the Pt electrode viewed in a direction along a synthetic axis of crystal axes a and b, and FIG. 10B is a view of the crystal structure of the Pt electrode viewed in a direction along a crystal axis c.

DETAILED DESCRIPTION OF THE EMBODIMENT

Figure 1:
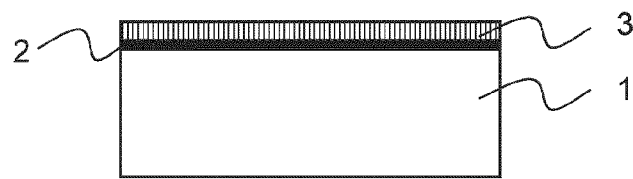
FIG. 1 is a cross-sectional view before forming a piezoelectric film using a lower electrode according to example 1 of the present invention.

Preferred embodiments of a piezoelectric film element and a manufacturing method of the same and a piezoelectric film device according to the present invention will be described hereafter. Before explaining the embodiments, a knowledge of the present invention will be described.

(Knowledge of the Present Invention)

A piezoelectric film element, being an object of this embodiment, is obtained by forming a lithium potassium sodium niobate film of a lead-free piezoelectric film corresponding to a basic part of the piezoelectric film element, on a lower electrode on which a Si substrate is formed.

In the lead-free piezoelectric film corresponding to the basic part of the piezoelectric film element, conventionally, an atomic level structure of an electrode material, being one of peripheral materials of the basic part, has neither been managed nor controlled quantitatively with good precision. Accordingly, an electrode structure is sometimes different depending on a formation part in the piezoelectric film element, and therefore a piezoelectric constant of the piezoelectric film formed on a substrate with large area, becomes non-uniform, and this is one of the causes of lowering a production yield.

In order to stably produce such a piezoelectric film element, so as to have a long service life and a high piezoelectric constant, the atomic level structure of the lower electrode material, being one of the peripheral materials of the basic part, needs to be controlled or managed quantitatively with good precision. This is because there is a strain of the Pt lower electrode layer, as one of the characteristic determination factors of the piezoelectric film element.

Therefore, first, regarding the lower electrode for determining an initial crystal growth state of the piezoelectric film, its crystal structure needs to be stably manufactured with good precision. Next, the strain of the manufactured lower electrode needs to be measured with good precision. The strain of the lower electrode can be obtained by a ratio of a crystal lattice spacing in a direction parallel to a substrate surface and a direction of a normal line to the substrate surface, by an In-plane and Out-of-plane X-ray diffraction methods, etc.

Regarding an electrode layer made of Pt which is generally frequently used, in order to control a crystal orientation of a dielectric film and a piezoelectric film formed on the electrode layer, a crystal orientation of the electrode layer is oriented preferentially in a direction of a specific axis in many cases. Such films having a structure thus oriented, include a thin film in which it is principally difficult to obtain the ratio of the crystal lattice spacing in the direction parallel to the substrate surface and in the direction of the normal line to the substrate surface, by the In-plane and Out-of-plane X-ray diffraction methods, etc.

Regarding the Pt electrode layer with (111) preferential orientation as well, being one of the embodiments of the present invention, it is difficult to analyze an amount of the strain of the crystal lattice for the same reason as described above, and therefore there is no clear index. Accordingly, regarding the Pt electrode layer with (111) preferential orientation, it is difficult to precisely control the amount of the strain. Therefore, conventionally, an evaluation by an optical lever method is performed with low precision, for measuring an amount of a warpage of a substrate itself, and based on this evaluation result, the electrode layer is manufactured.

However, in recent years, with a thinner film tendency of the upper/lower electrode layers and miniaturization of a device, an absolute value of the amount of warpage becomes small, which is the warpage of the substrate on which thin film is formed, and a sufficient area required for measurement can not be obtained, thus making it further difficult to evaluate the amount of the strain with high precision by the optical lever method. As a result, regarding the strain of the Pt lower electrode layer, precise control is difficult, thus making it difficult to stably produce a small-sized lead-free piezoelectric element having a desired high piezoelectric constant.

Therefore, based on the above-described knowledge, according to an embodiment of the present invention, in order to manage and control the piezoelectric properties of a lithium potassium sodium niobate film of the lead-free piezoelectric film, a sputtering method is used, so that the crystal structure of the Pt lower electrode that determines an initial crystal growth state of the piezoelectric film, can be stably manufactured with good precision. The lower electrode layer manufactured by the sputtering method has a preferential (111) plane orientation in a desired direction.

Further, regarding the lower electrode manufactured by the sputtering method, its lattice strain and an internal stress are focused. Then, by analyzing a structure by a newly devised analysis method of the lattice strain using the X-ray diffraction method, etc, improvement of manufacturing conditions of the electrode layer is achieved. A film formation temperature, a film formation gas, and a degree of vacuum, etc, being the manufacturing conditions of the electrode layer, are improved. Thus, the lower electrode layer having an improved lattice strain based on an atomic level structure is realized.

Note that structure analyses, etc, include an X-ray diffraction method and the other structure analysis method capable of estimating the lattice spacing, and is for example a structure analysis method using a transmission electron microscope and a structure analysis method using electron diffraction, and an Extended X-ray absorption fine structure (EXAFS) method, etc.

(An Embodiment)

A structure of a piezoelectric film element according to an embodiment of the present invention, a manufacturing method of a lower electrode using a sputtering method, and a lattice strain analysis method of the lower electrode will be described hereafter.

(Structure of the Piezoelectric Film Element)

Figure 5:
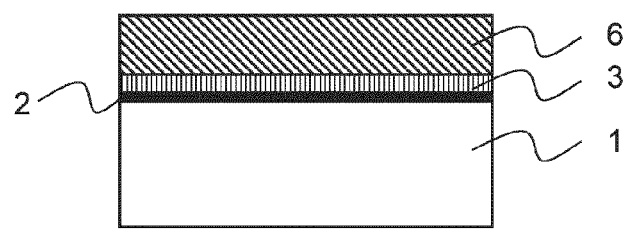
FIG. 5 is a cross-sectional view of a piezoelectric element using a piezoelectric film according to the example 1 of the present invention.

As shown in FIG. 5, the piezoelectric film element of this embodiment has a substrate 1; an oxide film (not shown) formed on a surface of the substrate 1; a lower electrode 3 formed on the oxide film; and a perovskite type piezoelectric film 6 formed on the lower electrode 3. The piezoelectric film 6 is expressed by $(Na_xK_yLi_z)NbO_3 (0 \le x \le 1, 0 \le y \le 1, 0 \le z \le 0.2, x+y+z=1)$, with the lower electrode 3 oriented in a prescribed direction, and the piezoelectric film 6 preferentially oriented in the prescribed direction with respect to the lower electrode 3.

As the substrate 1, Si substrate, MgO substrate, ZnO substrate, $SrTiO_3$ substrate, $SrRuO_3$ substrate, a glass substrate, a quartz glass substrate, GaAs substrate, GaN substrate, a sapphire substrate, Ge substrate, and a stainless substrate, etc, can be given.

Particularly, an inexpensive industrially proven Si substrate is desirable.

When the Si substrate is used, as the oxide film formed on the surface of the substrate 1, thermal oxide film $SiO_2$ formed by thermal oxidation, and Si oxide film formed by CVD (Chemical Vapor Deposition) method can be given. Note that a lower electrode layer such as Pt electrode may be directly formed on an oxide substrate such as quartz glass ($SiO_2$), MgO, $SrTiO_3$, $SrRuO_3$ substrates, without forming the oxide film.

The lower electrode 3 is preferably an electrode layer made of Pt or an alloy mainly composed of Pt, or the electrode layer of a lamination structure including the electrode layer mainly composed of Pt. Further, the lower electrode 3 is preferably formed in orientation to (111) plane, and a bonding layer for enhancing adhesiveness to the substrate may be provided between the substrate and the electrode layer made of Pt or the alloy mainly composed of Pt. After film formation of the Pt lower electrode, heat treatment may be applied in an atmosphere of oxygen, inert gas, or mixed gas of them, or in the atmospheric air or in a vacuum state. As the lower electrode 3, Au may be acceptable, or a Pt alloy, an alloy containing Ir, Ru, and Au, or a conductive oxide containing In and Sn may be acceptable.

Note that a state of a crystal orientation of the electrode film is sometimes changed and also the lattice strain of the electrode film is sometimes changed to a compressive force or a tensile force. Further, the state of the crystal orientation is sometimes set in a state without any force, namely, a state without strain, depending on a manufacturing condition of the lower electrode 3. Further, the state of the crystal orientation of the piezoelectric film formed thereon is sometimes changed and also an internal stress (strain) of the piezoelectric film is sometimes changed to the compressive force or the tensile force, depending on the manufacturing condition of the lower electrode. Moreover, the state of the crystal orientation is sometimes set in the state without any force, namely, the state without strain.

(A Manufacturing Method of the Lower Electrode Using the Sputtering Method)

Particularly, according to an embodiment of the present invention, by using the sputtering method, being a film forming method that has achieved a result of mass-production, a polycrystal lower electrode, or an epitaxially-grown single crystal lower electrode is manufactured. A typical control parameter of the manufacturing condition of the Pt lower electrode in this case is as follows.

By increasing a sputter power (Power) during film formation, being one of control parameters of the manufacturing condition, a lot of sputter particles are forcibly implanted into the substrate by an impact of energy particles such as Ar ion, and as a result, a highly-oriented Pt lower electrode having improved lattice strain, is manufactured. In this case, as a sputtering target, for example a disc-shaped metal target is used, and a sputtering charge power during film formation is set to 50 W to 500 W, and as sputtering gas, for example, 100% Ar gas or $O_2$ mixed gas, or mixed gas mixing at least one or more inert gases such as He or Ne or Kr or $N_2$, is used.

Further, a film formation temperature is focused as a control parameter of the lattice strain, and the Pt lower electrode layer having an improved lattice strain is manufactured in a temperature range from a room temperature to 800° C., more preferably in a range from 200° C. to 500°, so that the Pt lower electrode layer has (111) preferential orientation or has effective lattice strain.

Further, a heat treatment temperature after film formation is also controlled in a range from the room temperature to 800° C., thus realizing a manufacture of the Pt lower electrode internally having improved lattice strain.

The manufacturing condition of the Pt lower electrode is not limited to the aforementioned sputter power and sputtering gas, film formation temperature, and heat treatment temperature after film formation. As the other manufacturing condition, for example, distance between the substrate and a target, a rotation of the substrate, the manufacturing condition of the piezoelectric film, a film thickness of a film of the Pt lower electrode, the bonding layer, surface roughness of the Pt lower electrode layer, and the substrate, etc, can be given. These manufacturing conditions will be described hereafter.

A distance between the substrate at the side where the film formation is performed, and a sputtering target, being a raw material, is set to be a value between 50 to 150 mm. Whereby, a uniform Pt lower electrode can be manufactured.

Further, the substrate is rotated of its own and is revolved around a fixed sputtering target during film formation, to thereby obtain a uniform lattice strain distribution of the Pt lower electrode on the substrate (wafer) having a large area.

Further, regarding the piezoelectric film as well, which is formed on the Pt lower electrode of this embodiment, the sputtering charge power is controlled to fall in a range of 50 to 500 W, and a gas pressure introduced into a film forming apparatus is controlled to be several dozen Pa or less. By containing 0.1% or more of $O_2$, $N_2$, $H_2O$, etc, in sputter operation gas such as He, Ar, Kr, and Xe, a sodium potassium lithium niobate film showing a high piezoelectric constant can be formed. The piezoelectric film element having the sodium potassium lithium niobate film showing a high piezoelectric constant can be manufactured in the wafer uniformly with good production yield.

Further, there is a close correlation between the film thickness of the Pt lower electrode and the lattice strain thereof, and similar effect in improving the piezoelectric properties can be expected by designing the film thickness in a proper thickness.

Further, in order to improve a smoothness of the surface of the electrode layer, Ti layer is formed, with a smooth surface of several nm from 0.1 nm. Then, by forming the Pt lower electrode on an upper part of the Ti layer, a surface roughness of the Pt lower electrode can be controlled to be reduced in a size of several nm.

Further, by precisely controlling the film thickness of the Pt lower electrode, surface roughness of the Pt lower electrode is reduced, and a size of each crystal particle of the polycrystalline Pt lower electrode is controlled and formed to be uniform.

Further, as a candidate of the substrate on which the Pt lower electrode is formed, a crystal material or an amorphous material, or a composite material of them of the aforementioned Si, MgO, ZnO, $SrTiO_3$, $SrRuO_3$, glass, quartz glass, GaAs, GaN, sapphire, Ge, stainless, etc, is desirable. The bonding layer and the lower electrode layer are formed on the aforementioned substrate, and the sodium potassium lithium niobate film is formed thereon, to thereby obtain the piezoelectric film element. Regarding the piezoelectric film element thus obtained, the crystal orientation of each sodium potassium lithium niobate film is compared in detail. Thus, selection of the substrate capable of controlling the preferential orientation may be performed.

Further, the preferential orientation of the sodium potassium lithium niobate film may be achieved by finding manufacturing conditions of the piezoelectric film having the crystal orientation that improves the piezoelectric properties, such as the film formation temperature of the sodium potassium lithium niobate film itself, the kind of sputtering operation gas, an operation gas pressure, a degree of vacuum, charging power, and the heat treatment after film formation, and improving these manufacturing conditions. At this time, the piezoelectric film is constituted of a pseudo-cubic crystal system, or a tetragonal crystal system, or an orthorhombic crystal system, as a crystal system, and a crystal of $ABO_3$ or an amorphous material, or a mixed composition of them may be included in at least a part of such crystal systems. Here, A is at least one element selected from Li, Na, K, Pb, La, Sr, Nd, Ba, and Bi, B is at least one element selected from Zr, Ti, Mn, Mg, Nb, Sn, Sb, Ta, and In, and O is oxygen.

Particularly, during formation of a KNN film, the substrate is heated in a temperature range of 400° C. to 500° C., sputtering film formation is executed by plasma using mixed gas of Ar and $O_2$ in a ratio of 5:5, or gas obtained by mixing at least one or more inert gases such as Ar gas, or He gas, or Ne gas, or Kr gas, or $N_2$ gas. Further, heat treatment may be performed even after film formation, in an oxygen atmosphere, inert gas atmosphere, or in a mixed gas atmosphere of them, or in the atmospheric air or in a vacuum state.

(A Lattice Strain Analysis Method of the Lower Electrode)

As described above, in the lower electrode with preferentially oriented crystal axes, depending on an oriented lattice plane, it is difficult to obtain principally the ratio c/a of the lattice spacing in a direction parallel to the substrate surface and in a direction of the normal line to the substrate surface by the X-ray diffraction method. This is because it is difficult to confirm a diffraction peak of a preferential orientation in the direction parallel to the substrate surface ($\chi=90°$) which can be confirmed in the direction of the normal line to the substrate surface ($\chi=0°$), and therefore it is difficult to measure lattice spacing "a" by In-plane method of measuring the lattice spacing in a state that a sample is rearranged at $\chi=90°$.

According to example 2 as will be described later, when the Pt lower electrode has (111) preferential orientation, its diffraction peak can be confirmed at $\chi\sim70°$. Accordingly, when the lower electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, an estimated range, in which the diffraction peak can be confirmed, is considered to fall within a range of 60° or more and 80° or less, and is considered to fall within a range of 50° or more and less than 90° if being viewed from a broader range. Namely, the estimated range is considered to fall within a range of 0° or more and 40° or less, and further preferably within a range of 10° or more and 30° or less if being viewed from an inclination angle from the substrate surface. Then, within these angle ranges, an analysis result can be regarded as structure information in the direction almost parallel to the substrate surface, and lattice spacing a' can be measured. A measurement method of obtaining the ratio of the already existent lattice spacing c with respect to the aforementioned lattice spacing a' is a newly devised analysis method of the lattice strain as described above.

According to an aspect of the present invention, polycrystal or epitaxially-grown single crystal Pt lower electrode is obtained by setting ratio c/a' (called a lattice strain parameter hereafter) to fall within a range of a fixed ratio, c/a' being obtained from lattice constant c in a direction of a normal line to a substrate surface, and lattice constant a' in a direction inclined from the substrate surface by about 10° to 30°.

c/a' is a structure parameter for clearly expressing the lattice strain of the Pt electrode having (111) preferential orientation, and is also a control parameter which is a key to improve properties of the piezoelectric film. Actually, in order to achieve improved c/a', the film formation temperature and the heat treatment temperature are controlled to fall within a fixed range, by using a thermal radiation by an infrared lamp or a heat conduction by laser radiation or heating by a heater via a heat transfer plate.

According to an aspect of the present invention, in the piezoelectric film element composed of a lamination structure of at least the lower electrode, the piezoelectric film, and the upper electrode on the substrate, an amount of the lattice strain of the lower electrode is expressed by c/a', being the ratio of the aforementioned two lattice spacing, by using the lattice spacing a' whose inclination angle from the substrate surface is in a range of 10° or more and 30° or less, and the lattice spacing c in the direction of the normal line to the substrate surface, and the c/a' is preferably precisely set in a range of 0.992 or more and 0.999 or less which is closer to 1, and more preferably set in a range of 0.993 or more and 0.998 or less. Thus, the piezoelectric properties of the lead-free piezoelectric film element can be freely controlled or improved.

Further, according to other embodiment of the present invention, internal stress $\sigma_{\phi}$ obtained from the ratio c/a' of the lattice spacing c in the direction of the normal line to the substrate surface, with respect to the lattice spacing a' whose inclination angle from the substrate surface is in a range of 10° or more and 30° or less, is preferably precisely set in a range of 0.137 GPa or more and 1.104 GPa or less, and further preferably set in a range of 0.274 GPa or more and 0.965 GPa or less. In this way as well, the piezoelectric properties of the lead-free piezoelectric film element can be freely controlled or improved.

[A Manufacturing Method of the Piezoelectric Film Element]

A manufacturing method of a piezoelectric film element according to an embodiment of the present invention is a method for forming on a substrate at least a lower electrode, a piezoelectric film expressed by a general formula $(Na_xK_yLi_z)NbO_3$ ($0 \leq x \leq 1$, $0 \leq y \leq 1$, $0 \leq z \leq 0.2$, $x+y+z=1$), and an upper electrode respectively by sputtering, wherein film formation is performed so that at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and by controlling any one of a film formation temperature of the lower electrode, a film thickness of an electrode film, or a heat treatment temperature after film formation, or two or more of them, a ratio c/a' is set in a range of 0.99 or more and 0.999 or less, which is the ratio of a crystal lattice spacing c in a direction of a normal line to the substrate surface, with respect to a crystal lattice spacing a' whose inclination angle from the substrate surface is in a range of 10° or more and 30° or less.

Further, a manufacturing method of a piezoelectric film element according to other embodiment is a method, comprising the step of evaluating at least the lower electrode out of the lower electrode and the upper electrode, by measuring a crystal lattice spacing c in a direction of a normal line to the substrate surface, and a crystal lattice spacing a' whose inclination angle from the substrate surface is in a range of larger than 0° and 40° or less.

[A Piezoelectric Film Device]

Figure 22:
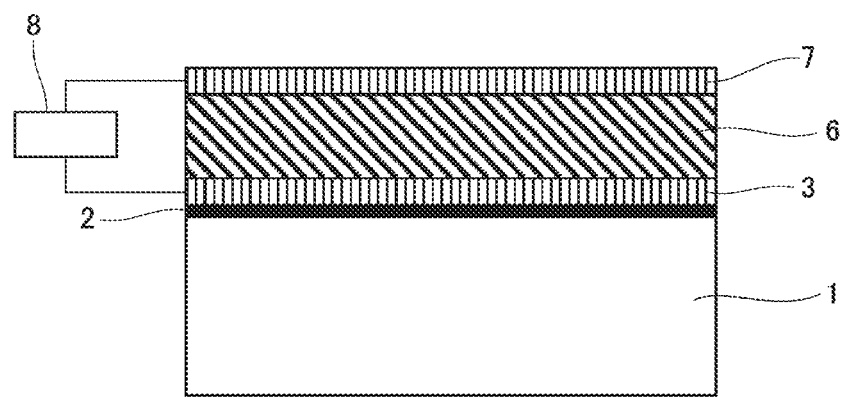
FIG. 22 is a cross-sectional view of a piezoelectric film device according to an embodiment of the present invention.

Further, a piezoelectric film device according to an embodiment of the present invention is obtained by forming the aforementioned piezoelectric film element into a device. As shown in FIG. 22, the piezoelectric film device comprises on a substrate 1, a bonding layer 2; and a piezoelectric film element on which a lower electrode 3, $(Na_xK_yLi_z)NbO_3$ piezoelectric film (KNN film) 6, and an upper electrode 7 are formed sequentially. This piezoelectric film element can be manufactured as each kind of actuator or sensor, by molding it into a prescribed shape and providing a function generator or a voltage detection part 8.

Particularly, by reducing an internal stress of the piezoelectric film, the piezoelectric properties of the piezoelectric film element and the piezoelectric film device can be improved and stabilization thereof is realized, thus making it possible to provide a micro-device with high performance at a low cost. Further, depending on the device, from a viewpoint of controlling element intensity, etc, the internal stress is controlled by increasing/decreasing the film thickness of the piezoelectric film, etc, and a substrate with high elastic modulus such as Young modulus is selected. Then, the internal stress is improved, and wide variety of micro-devices with high performance can be provided.

(Effects of the Embodiment)

According to an embodiment of the present invention, in a piezoelectric film lamination in which at least a lower electrode, a piezoelectric film, and an upper electrode are disposed on the substrate respectively, wherein the lower electrode film has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of them are preferentially oriented to a specific axis smaller than or equal to two axes of these crystals, and by controlling the lattice strain in a range of that the ratio c/a' is 0.992 or more and 0.999 or less, and more preferably 0.993 or more and 0.998 or less which is the ratio of a crystal lattice spacing c in a direction of a normal line to the substrate surface, with respect to a crystal lattice spacing a' whose inclination angle from the substrate surface is in a range of 10° or more and 30° or less, the piezoelectric properties of the lead-free piezoelectric film element can be freely controlled or improved.

Further, by using a Pt electrode or a Pt alloy as the lower electrode of the piezoelectric element, and making the lower electrode having the preferential orientation (111) in a vertical direction to the substrate surface, the orientation of the piezoelectric film formed thereon can be improved. Thus, the piezoelectric properties can be further improved.

Further, the orientation of the piezoelectric film can be similarly improved by using an oxide of Ru, Ir and a compound with an element contained in the piezoelectric film. As the substrate used at this time, substrates such as MgO substrate, ZnO substrate, SrTiO$_3$ substrate, SrRuO$_3$ substrate, glass substrate, quartz glass substrate, GaAs substrate, GaN substrate, sapphire substrate, Ge substrate, and stainless substrate can be used in addition to Si. Thus, the crystal orientation of the piezoelectric film formed on these substrates can be controlled. Whereby, the piezoelectric properties can be further improved.

Further, according to an embodiment of the present invention, the piezoelectric film element can be provided, capable of selecting the piezoelectric film, the electrode, the substrate, and the bonding layer, being constituent materials, and also improving the manufacturing conditions of these materials, and in order to clarify the correlation between the piezoelectric properties obtained thereby and an electrode structure, quantitatively performing a precise and detailed analysis, and based on a result thereof, precisely controlling an atomic level structure of the electrode film, thereby improving the piezoelectric properties of the lead-free piezoelectric element, and the manufacturing method of the piezoelectric film element can be provided capable of realizing the thin film piezoelectric device with high performance and also improving the production yield of the piezoelectric film element.

Further, according to an embodiment of the present invention, the piezoelectric film element showing a high piezoelectric constant can be manufactured by forming the upper electrode layer in an upper part of the piezoelectric film, on the substrate with the piezoelectric film manufactured by accurately quantifying, controlling, and managing the lattice strain of the lower electrode, and the piezoelectric film device such as each kind of actuator and sensor can be manufactured by molding the piezoelectric film element into a prescribed shape, and providing the function generator and the voltage detector. By improving and stabilizing the piezoelectric properties of the piezoelectric film element and the device thereof by stably controlling the crystal orientation of the thin films, the micro-device with high performance can be provided at a low cost.

Further, according to an embodiment of the present invention, the piezoelectric film with excellent piezoelectric properties can be provided, and the piezoelectric film element with high production yield and high quality can be provided. Further, the piezoelectric film element according to an embodiment of the present invention has the piezoelectric film not using lead. Accordingly, by mounting the piezoelectric film element according to an embodiment of the present invention, an environmental load is reduced, and a small-sized device such as small-sized motor, sensor, and actuator with high performance, for example, MEMS (Micro Electro Mechanical System), etc, can be realized.

EXAMPLES

Next, examples of the present invention will be described.

Example 1

In example 1, the Pt lower electrode film with (111) preferential orientation was formed on the substrate with an oxide film, to thereby manufacture the substrate with the Pt film, and further the KNN film with (001) preferential orientation was formed on the Pt lower electrode film, to thereby manufacture the substrate with the piezoelectric film.

(Formation of the Substrate with the Pt Film)

FIG. 1 shows a schematic cross-sectional structure of the substrate with the Pt film according to the example 1. The substrate with the Pt film is formed, so that SiO$_2$ film (not shown), Ti bonding layer 2, and Pt lower electrode 3 are sequentially formed on the Si substrate 1.

Next, the manufacturing method of the substrate with the Pt film according to the example 1 will be described.

First, thermal oxide film SiO$_2$ (film thickness 100 nm) was formed on the surface of the Si substrate 1 ((100) plane direction, thickenss: 0.5 mm, size: 20 mm×20 mm). Next, Ti bonding layer 2 (film thickness 2 nm), and Pt lower electrode 3 of a polycrystalline film (having (111) preferential orientation, film thickness: 100 nm)) were formed on the Si substrate 1 with the thermal oxide film by RF magnetron sputtering method. A disc with a diameter of 4 inches (about 100 mm) was used for a sputtering gate material of Ti and Pt, being materials. Further, a distance between the substrate 1 with the thermal oxide film, and the sputtering gate was set to 100 mm. Ti adhesive layer 2 and Pt lower electrode 3 were formed by setting a substrate temperature to 350° C., the sputtering charging electric power (discharge power) set to 100 W, in introduction gas Ar atmosphere, under a pressure of 2.5 Pa, and by setting a film formation time to 1-3 minutes for the Ti adhesive layer 2, and setting a film formation time to 10 minutes for the Pt lower electrode 3. Then, after the film formation of the Pt lower electrode 3, heat treatment was applied thereto in the atmosphere at 750° C. for 1 hour.

Further, in order to uniformizing a distribution of the Pt electrode structure in the Si substrate having a large area, for example, having a size of 4 inches and 6 inches, the temperature of the substrate is controlled gradually between 2 inches and 4 inches in a radius vector direction from a center of the substrate, to thereby have a temperature distribution in a range of 350° C.-100° c. Further, the substrate is rotated of its own and is revolved around a fixed sputtering target during film formation of Ti and Pt, the lattice strain of the Pt electrode can be homogenized. Further, two layer film formation is performed, in which the film formation of Pt is performed twice. At this time, by dividing the sputtering charge electric power into 150 W and 300 W, the lattice strain in the substrate having a large area can be homogenized. In addition, by lengthening a distance between the sputtering target and the substrate from 100 mm to 150 mm so as to suit to the size of the substrate, the Pt electrode having a homogenized lattice strain can be manufactured on the substrate having a large area.

(Evaluation of the Pt Lower Electrode)

Figure 2:
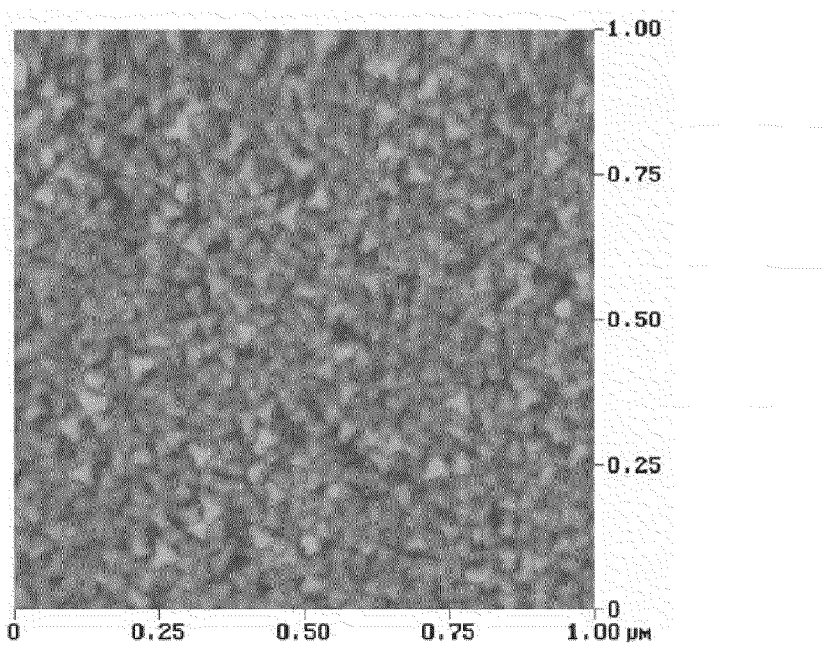
FIG. 2 is a surface shape photograph of a Pt electrode measured by an atomic force microscope according to the example 1 of the present invention.

FIG. 2 shows a surface shape image of the Pt lower electrode film measured by the atomic force microscope. A texture of crystal fine particles is observed on the surface, and it is found that individual particle is formed into almost an equilateral triangle. From this fact, it can be estimated that (111) crystal plane orientation is formed on the substrate surface, as is considered from the crystal structure of Pt of FIG. 3, if it is taken into consideration as described above that Pt is a face centered cubic lattice.

Figure 4:
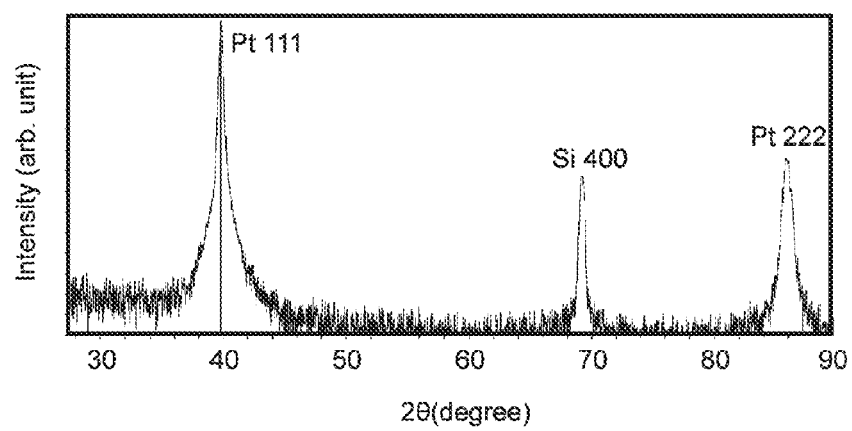
FIG. 4 is an example of an X-ray diffraction pattern of 2θ/θ scan of the Pt electrode according to the example 1 of the present invention.

As a result of examining the crystal structure of the Pt lower electrode film by a general X-ray diffractometer, diffraction peaks of 111, 222 can be observed as shown in an X-ray diffraction pattern (2θ/θ scan measurement) of FIG. 4, and diffraction peaks of other 200, 220, 311 can not be confirmed. Thus, it is clarified that the Pt film having (111) preferential orientation on the substrate surface is formed.

(Manufacture of the Substrate with the Piezoelectric Film)

The substrate with the piezoelectric film having a structure shown in FIG. 5 was manufactured. The substrate with the piezoelectric film was formed so that $(Na_xK_yLi_z)NbO_3$ piezoelectric film (KNN piezoelectric film) 6 was further formed on the Pt lower electrode 3 of the substrate with the Pt thin film.

The $(Na_xK_yLi_z)NbO_3$ piezoelectric film (KNN piezoelectric film) 6 was further formed on the Pt lower electrode 3 by RF magnetron sputtering method, until a film thickness thereof was 3 μm. The film formation was performed by using a ceramic target expressed by $(Na_xK_yLi_z)NbO_3$, x=0.5, y=0.5, z=0, under conditions of the substrate temperature: 450° C., discharge power: 100 W, in the introduction Ar atmosphere, under pressure of 0.4 Pa. The film formation time was set to 4 hours. Further, after the film formation, the film was cooled to a room temperature and heat treatment (annealing) was applied thereto for 8 hours at 650° C. in the atmosphere.

(Evaluation of the Knn Film)

Figure 6:
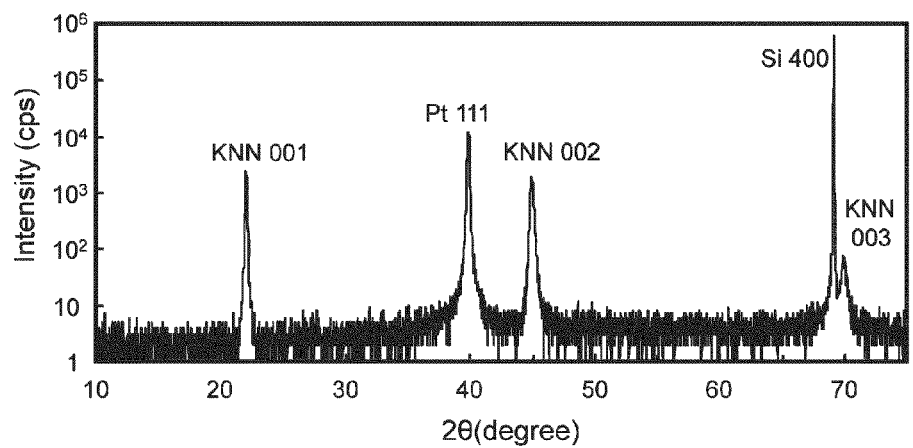
FIG. 6 is an example of an X-ray diffraction pattern of 2θ/θ scan in a piezoelectric film element according to the example 1 of the present invention.

When a cross-sectional shape of the KNN film thus manufactured was observed by a Scanning Electron Microscope, it was found that its texture had a columnar structure. Further, when the crystal structure was examined by a general X-ray diffractometer, it was found that the formed KNN film was a polycrystalline film having a perovskite type crystal structure of a pseudo-cubic crystal system. Further, as is clarified from the X-ray diffraction pattern of FIG. 6, it can be estimated that the KNN piezoelectric film has almost a preferential orientation in (001), because diffraction peaks of 001, 002, 003 can be confirmed. Therefore, when a pole figure was measured to evaluate the orientation of the KNN film, (001) preferential orientation was clarified. Regarding details of the measurement of the pole figure, see following cited documents 1 to 3.

[Document 1]: Revised 4-th version of Guide to X-ray diffraction edited by Rigaku Corporation, (Rigaku Corporation 1986)

[Document 2]: Elements of X-ray Diffraction $2^{nd}$ ed. written by B. D. Cullity (Addition-Wesley, Reading, Mass., 1977)

[Document 3]: Residual stress and distortion, written by Hajime Sudo, (Uchida Rokakuho, 1988)

Example 2

(Pt Electrode Strain Analysis)

In example 2, a lattice strain analysis of the Pt lower electrode manufactured in the example 1 was performed.

In the lattice strain analysis of the Pt electrode according to the example 2, X-ray diffractometer with high power rotating anode was used, having a two-dimensional detector mounted thereon, and having an X-ray detection area of a large area.

When a large-sized substrate of 4 inches and 6 inches was used, as the lattice strain analysis of the Pt electrode, the lattice strain was evaluated by using the X-ray diffractometer with high power rotating anode having a two-dimensional detector mounted thereon, and having an X-ray detection area of a large area (a solid angle of a wide range), by cutting the large-sized substrate into 20 mm square so that a sample can be accommodated in an analyzer. Note that in a device provided with a sample stage for a substrate having a large area, the lattice strain analysis can be performed in a state of the substrate as it is without applying any processing thereto.

This diffractometer is a two-dimensional detector "D8 DISCOVER with Hi STAR, VANTEC2000 (registered trademark)" produced by Bruker AXS Corporation. If this two-dimensional detector is used, an X-ray diffraction profile in a reciprocal lattice space of a wide range can be measured for a short period of time, and a wide area reciprocal lattice point map can be acquired speedily.

(Out of Plane/in-Plane Method)

Figure 7:
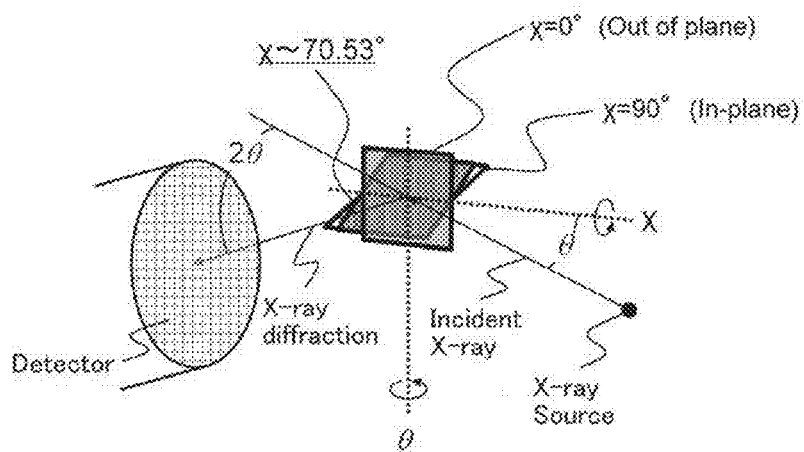
FIG. 7 is an experiment arrangement view in a lattice strain measurement of a Pt electrode according to example 2 of the present invention.

FIG. 7 shows an X-ray diffraction measurement arrangement view at the time of analyzing the lattice strain of the Pt electrode having the (111) preferential orientation performed in this example 2. θ shown here is a generally called an X-ray diffraction angle, and when scanning at 2θ/θ is performed, a diffraction peak is observed at an angle corresponding to Bragg reflection of the individual crystal plane, and lattice spacing (lattice constant) can be obtained from this angle. In a normal X-ray diffraction method, a sample is set to the upright of χ=0° (out of plane). However, in this case, only structure information (lattice spacing) in a normal line direction, namely, in a film thickness direction, with respect to the substrate surface can be obtained, and this is insufficient as the analysis method of the lattice strain of the thin film.

In order to compensate for a problem that as described above, this is insufficient as the analysis method of the lattice strain of the thin film, it might be necessary to measure the lattice spacing in a (parallel) direction along the substrate surface in a state of rearranging the sample at χ=90° (in-plane), and analyze a measurement result in this In-plane state by comparing it with a measurement result in the Out of plane state. As a result, if the ratio c/a of the lattice spacing is obtained in a direction vertical to the substrate surface and in a direction parallel to the substrate surface, the lattice strain of the thin film with an atomic level can be quantitatively evaluated.

However, when the thin film is preferentially oriented to a certain specific axis, In-plane measurement is sometimes principally impossible, depending on its crystal plane. The Pt electrode film in this example 2 has a cubic crystal system, and is set in (111) preferential orientation state. Regarding the film having the cubic crystal system, set in the preferential orientation state, it is difficult to measure the lattice spacing in the In-plane state at $\chi=90°$.
(Broad Reciprocal Lattice Point Simulation/Measurement, Analysis of Broad Reciprocal Lattice Point Map)

Figure 8:
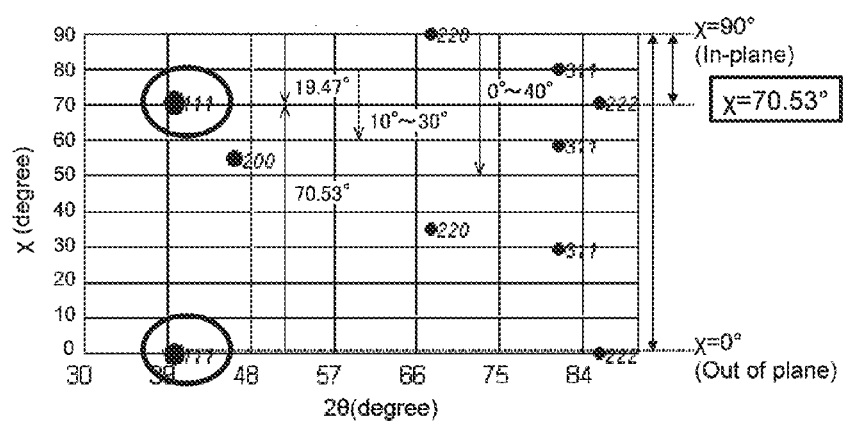
FIG. 8 is an example of a simulation of a reciprocal space mapping in a Pt electrode with (111) preferential orientation according to the example 2 of the present invention.

FIG. 8 shows a result of a reciprocal lattice point simulation in the Pt thin film having the (111) orientation. The vertical axis shows •, and the horizontal axis shows 2θ. Symbol • shows each diffraction point in the (111) orientation. Here, the reciprocal point simulation was performed by using SMAP/for Cross Sectional XRD-RSM provided by Bruker AXS Corporation.

Figure 3:
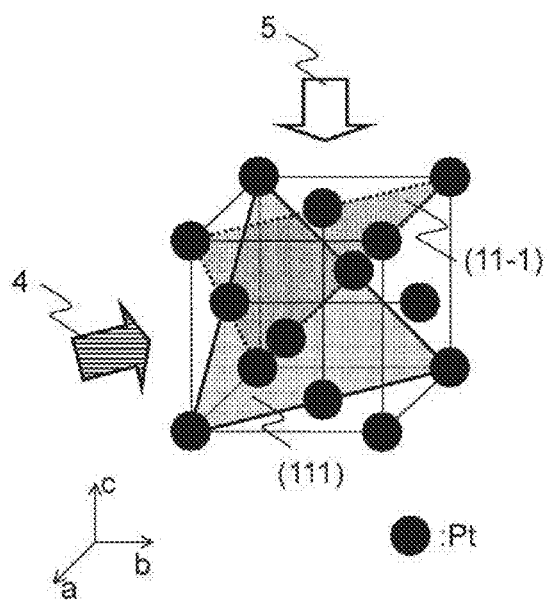
FIG. 3 is a crystal structure of the Pt electrode according to the example 1 of the present invention.
Figure 9:
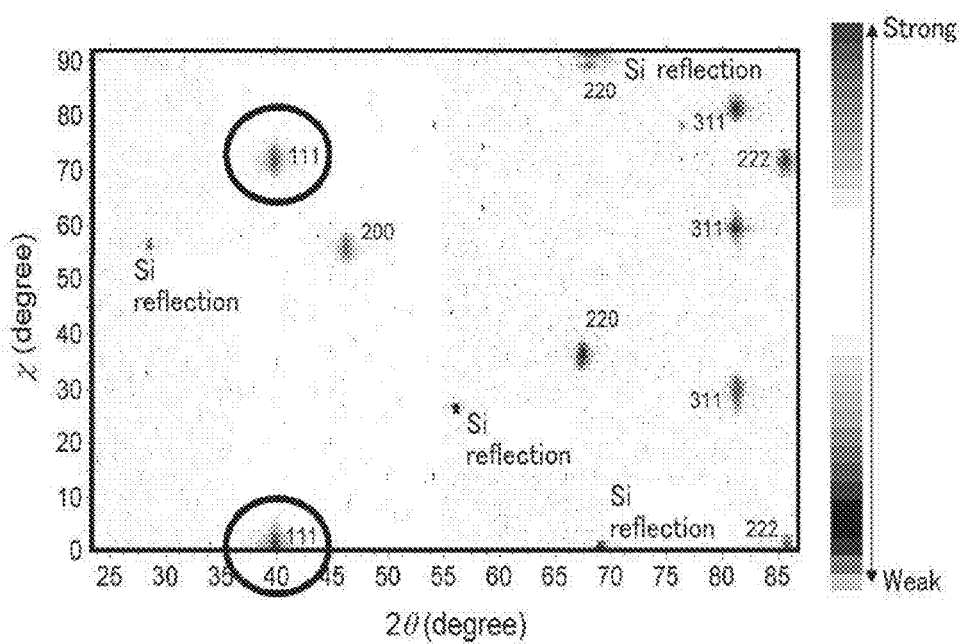
FIG. 9 is an example of a measurement result of the reciprocal space mapping in the Pt electrode with (111) preferential orientation according to the example 2 of the present invention.

In consideration of the simulation result, measurement and analysis of the broad reciprocal lattice point map was performed for the Pt lower electrode film of this example 2. FIG. 9 shows the result. As is clarified from this measurement result, a reciprocal lattice point spot of Pt coincides with the simulation result, excluding a reflection spot from the Si substrate. Namely, it is found that the measurement result is obtained as theory shows. Here, as shown in FIG. 8 and FIG. 9, the diffraction points of 111 and 222 exist at $\chi=0°$ and •=70.53°. This can be understood if the crystal structure of a face-centered cubic lattice of Pt shown in FIG. 3 is taken into consideration. Explanation will be given hereafter.
(The Reason why the Diffraction Points of 111 and 222 Exist at $\chi=0°$ and $\chi=70.53°$)

Figure 10:
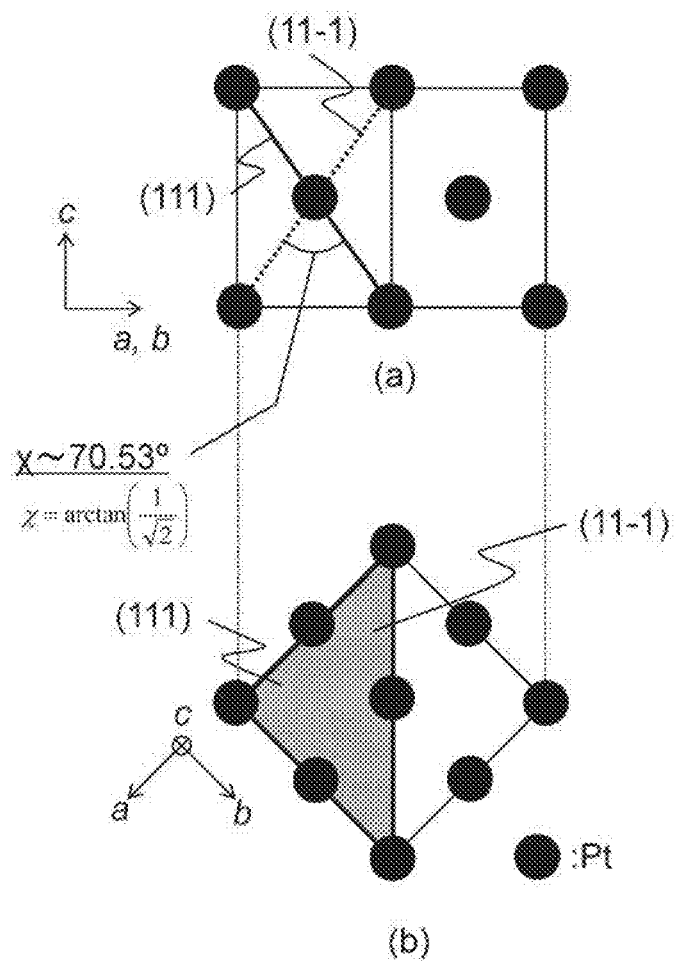

FIG. 10A is a view of the face-centered cubic lattice of Pt of FIG. 3 viewed straight horizontally from a direction 4, along a synthetic axis of a-axis and b-axis, and FIG. 10B is a view of the face-centered cubic lattice of Pt of FIG. 3 viewed directly downward from a direction 5, along crystal axis c in the face-centered cubic lattice of Pt. As is clarified from these views, if {111} crystal plane is focused, conceivable crystal planes equivalent to (111) are (11-1), (1-11) and (-111), because Pt is the cubic crystal system. At this time, it is found that an angle formed by these three crystal planes and (111) plane is arctan $(1/\sqrt{2})$, if a length of each side of the face-centered cubic lattice is taken into consideration. This angle is about 70.53° if it is expressed by an angle unit. This shows a relation equivalent to an angle of the $\chi$-axis of the diffraction spots of 111 and 222 observed in the aforementioned broad reciprocal lattice point map of FIG. 8 and FIG. 9. Namely, this shows that by inclining a sample substrate by 70.53° from the upright, reflection of Bragg directed to (11-1) plane appears.
(Reason why Quantitative Evaluation of the Lattice Strain in a State of In-Plane is Difficult, Regarding the Pt Film with (111) Preferential Orientation)

As described above, regarding the film in a state of the (111) preferential orientation, measurement of the lattice spacing in the state of In-plane at $\chi=90°$ is difficult, because the lattice plane exists at $\chi=$about 70.53°. Further, the diffraction spots are measured on a film formed of a polycrystalline body (including the thin film) having individual crystal grains arranged in the "preferential orientation" in a certain specific direction, and therefore the diffraction spots are hardly found in the thin film having individual crystal grains arranged at random. Further, the same thing can be said for 200, 220, 311 diffractions shown in FIG. 8 and FIG. 9, and a difference in the angle of $\chi$ that can exist at this time, is 60° or less. Accordingly, regarding the 200, 220, 311 diffractions as well, it is difficult to secure 90°, being the difference of the angle of $\chi$ which is required for changing a sample arrangement from Out of plane to In-plane, similarly to 111 diffraction. As a result, regarding the Pt film with (111) preferential orienta- tion, it is difficult to directly derive the lattice strain which is genuinely obtained from an aspect ratio of the lattice spacing.

Here, the aspect ratio of the lattice spacing is a ratio of lattice constant c in an out-of-plane direction, to lattice constant a in an in-plane direction. As shown in FIG. 3, the lattice constant c in the out-of-plane direction is a lattice constant of the Pt film in a direction vertical to the substrate surface (out-of-plane direction), and the lattice constant a in the in-plane direction is a lattice constant of the Pt film in a direction parallel to the substrate surface (in-plane direction).
(Study on a Pseudo Lattice Strain Analysis)

Therefore, the diffraction points of 111 and 222 at $\chi=0°$ and $\chi=70.53°$ were focused, and particularly an analysis result at $\chi=70.53°$ was regarded as the structure information in the direction almost parallel to the substrate surface (inclined surface of 19.47° with respect to the substrate surface), and further study was performed whether pseudo lattice strain analysis could be performed. As a result, it is found that the analysis method of this example 2 is effective, and it is confirmed that an internal stress analysis simulating a conventionally performed X-ray stress analysis method is also possible. Namely, as shown in FIG. 7, by measuring X-ray diffraction with the angle of the $\chi$-axis set at 0° and 70.53°, the lattice spacing or the lattice constant c ($\chi=0°$) in the normal line direction to the substrate surface, and the lattice constant a' ($\chi=70.53°$) in the direction parallel to the surface inclined by 19.47° with respect to the substrate surface, can be obtained. Here, lattice constants c and a' were obtained by the following formula (1). Here, Pt is assumed to be the cubic crystal system.

$$c, a' = [\lambda(h^2+k^2+l^2)^{1/2}]/(2 \sin \theta) \quad (1)$$

Here, λ was a wavelength of used X-ray, and $K_\alpha$-ray, being characteristic X-ray of Cu was used in this embodiment. Further, h, k, l are Miller indices of diffraction X-ray corresponding to the individual crystal plane, and θ is a diffraction angle of the diffraction X-ray.

Note that depending on the crystal structure of a used electrode (for example, a tetragonal crystal system, an orthorhombic crystal system, a hexagonal crystal system, a monoclinic crystal system, a triclinic crystal system, a trigonal crystal system (rhombohedral), etc), formula (1) needs to be changed accordingly. See documents 1 and 2 for details.
(Lattice Strain Parameter c/a')

The diffraction angle of the diffraction peak in this example was obtained by fitting analysis using a statistic distribution function generally used for spectrum analysis. Note that analysis was performed by suitably selecting a distribution function such as Gaussian function, Lorentz function and Pseudo Voight function, being a convolution function of them, Pearson function, and Split Pseudo Voight function, in accordance with a shape of a profile such as a symmetry of the diffraction peak. By using a result of them, ratio c/a' was obtained, which was defined as a lattice strain parameter of the Pt electrode. If this lattice strain parameter c/a' was used, the lattice strain of the electrode can be precisely controlled, and the lead-free piezoelectric film element with high performance according to this example 2 can be realized.
(Utilization of Internal Stress $\sigma_\Phi$)

Further, c/a', being the lattice strain parameter of the Pt electrode, can be expressed by a generally used internal stress $\sigma_\Phi$, by being applied to the following formula (2).

$$\sigma_\Phi = \{E/[(1+\nu)\sin^2\psi]\} \times [1/(c/a')-1] \quad (2)$$

Here, an elastic constant of the Pt electrode film was set to be the same as that of a bulk body, and Young modulus was simulated to be E=168 GPa, and Poisson's ratio was simulated to be ν=0.38, and ψ was simulated to be ψ=70.53°, which was the same as χ. Thus, a residual stress of Pt in the in-plane direction can be analyzed simulatively. Diffraction of c/a' used at this time is 111. According to the example 2 of the present invention, c/a' is about 0.9935 when the piezoelectric constant of the piezoelectric film element is about 90 (see FIG. 17 of example 4). When this value is substituted into formula (2), the internal stress of the Pt electrode is 0.896 GPa. Namely, when the piezoelectric constant of the piezoelectric film element is about 90, the internal stress of the Pt electrode film is $\sigma_{\Phi}$=0.896 GPa.

Note that the Young modulus and the Poisson's ratio of the thin film are different from those of the bulk body in some cases, and an influence given from the substrate can not be ignored, and therefore an accurate value is unclear. However, this value is actually a reliable value, and a calculated value using formula (2) can be said as an actual internal stress of the Pt thin film. See documents 1, 2, 3 for details.

Further, regarding ψ, it is necessary to read values of the χ-axis of the diffraction spots obtained from the broad reciprocal lattice map of FIG. 9 and calculated by substituting this value into individual Ψ.

Example 3

In this example 3, in order to realize the Pt electrode having a proper lattice strain based on the atomic level structure, the lattice strain of the Pt lower electrode with (111) preferential orientation was intentionally changed by changing a manufacturing condition of the Pt electrode layer which is manufactured by example 1.
(Film Formation Temperature Dependence of the Lattice Strain of the Pt Lower Electrode)

Figure 11:
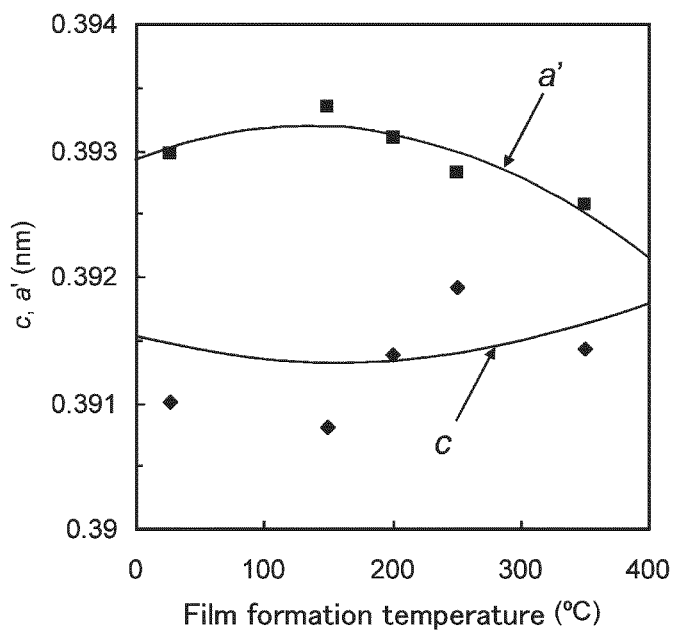
FIG. 11 is a correlation view between a film formation temperature of the Pt electrode by sputtering, and lattice constants c and a' according to the example 2 of the present invention.

FIG. 11 shows a variation of the lattice constant c in the normal line direction to the substrate surface and the lattice constant a' parallel to a surface inclined to the substrate surface at about 19.47°, with respect to the film formation temperature (substrate temperature). At this time, the lattice spacing (lattice constant c) in the normal line direction to the substrate surface was 0.39 nm or more, and meanwhile, the lattice spacing (lattice constant a') in the direction inclined to the normal line of the substrate surface at an angle in a range of 60° to 80° was 0.395 nm or less.

The film formation temperature was varied in a range of 20° C. (room temperature), 150° C., 200° C., 250° C., and 350° C. Although lattice constants c and a' at this time are largely varied, a systematic variation was observed. Namely, the lattice constant c has an inclination of being almost increased from about 0.3910 to about 0.3914, as the film formation temperature is increased. Meanwhile, the lattice constant a' has an inclination of being almost decreased from about 0.3930 to about 0.3926, as the film formation temperature is increased.

Figure 12:
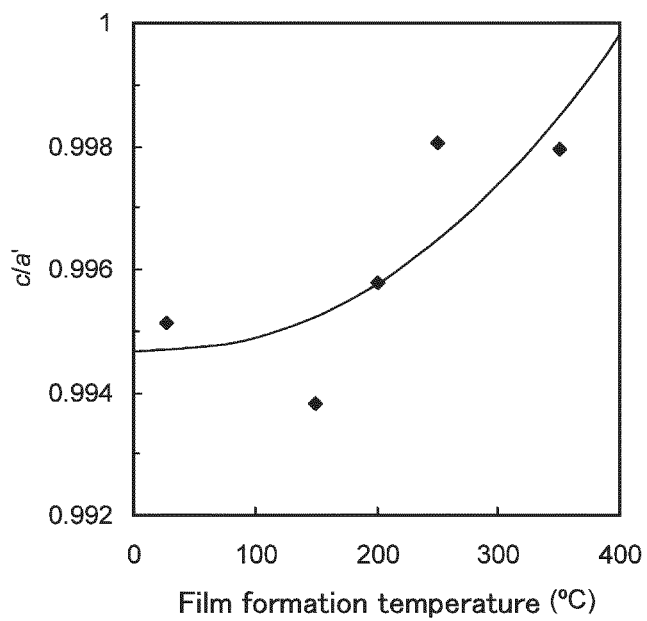
FIG. 12 is a view showing a variation of a lattice strain parameter c/a' with respect to the film formation temperature of the Pt electrode by sputtering according to example 3 of the present invention.

Next, by using these results, a film formation temperature dependency of the lattice strain of the Pt lower electrode was examined. FIG. 12 shows a variation of a lattice strain parameter c/a' with respect to the film formation temperature of the Pt lower electrode. As shown in this figure, it is found that the lattice strain parameter c/a' is increased, as the film formation temperature is increased. When the film formation temperature is high like 250° C. to 350° C., c/a' is about 0.9980 and is close to 1. This means that with a higher film formation temperature, the lattice strain of the formed Pt lower electrode becomes smaller accordingly. Meanwhile, when the film formation temperature is smaller like 200° C. to 20° C. (room temperature), c/a' is decreased from about 0.9960 to about 0.9956. Namely, c/a' is smaller than 1, and lattice spacing a' in a direction almost parallel to the substrate surface is larger than the lattice spacing c in the normal line direction to the substrate surface, and the Pt lower electrode is set in a lattice strain state of a tensile force in the surface of the substrate.
(Film Thickness Dependence of the Lattice Strain of the Pt Lower Electrode)

Figure 13:
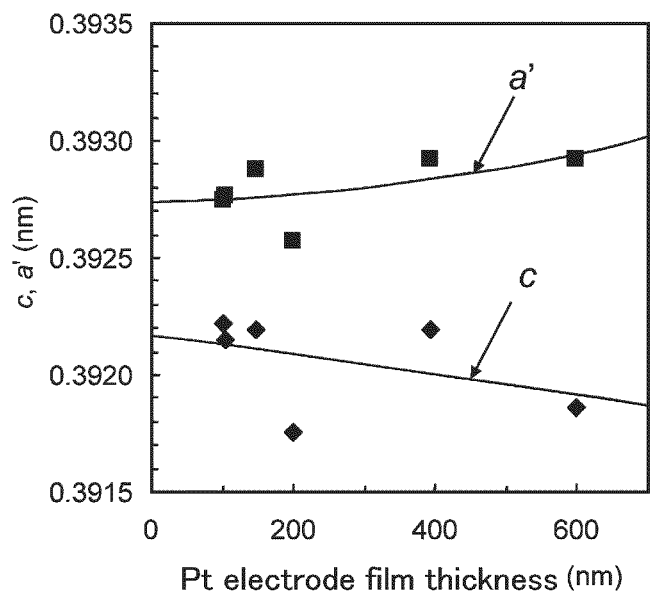
FIG. 13 is a correlation view between a film thickness of the Pt electrode formed by sputtering, and lattice constants c and a' according to the example 3 of the present invention.

Next, as one of the results of this example, FIG. 13 shows the variation of the lattice constant c in the normal line direction to the substrate surface, and the lattice constant a' parallel to the substrate surface inclined to the substrate surface at about 19.47°, with respect to the Pt lower electrode film thickness manufactured by a sputtering film formation method. The lattice constant c is varied from about 0.3922 to about 0.3919, as the film thickness of the Pt electrode is increased in a range of 100 n, 150 m, 200 nm, 400 nm, and 600 nm, and has a tendency of being decreased. Meanwhile, it is found that the lattice constant a' is varied from about 0.3928 to about 0.3920 and has a tendency of being increased, as the film thickness of the Pt electrode is similarly increased.

Figure 14:
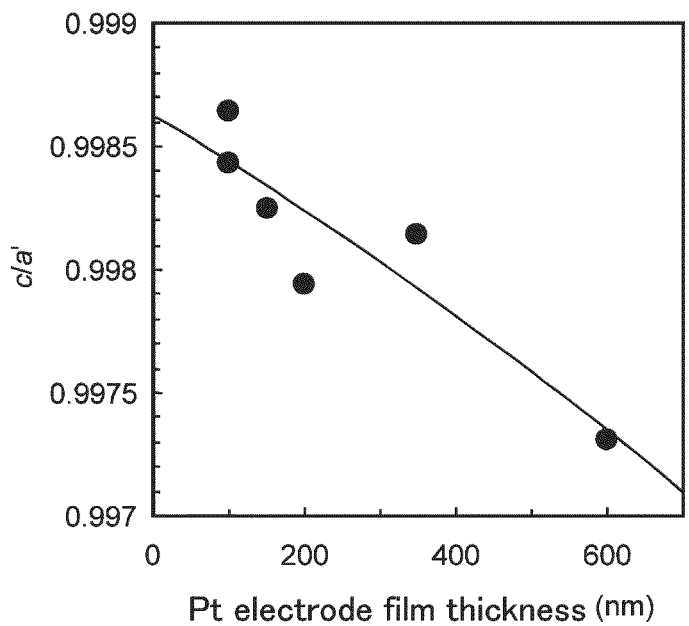
FIG. 14 is a view showing a variation of the lattice strain parameter c/a' with respect to the film thickness of the Pt electrode formed by sputtering according to the example 3 of the present invention.

Next, by using these results, the film thickness dependency of the lattice strain of the Pt lower electrode was examined. FIG. 14 shows a relation between the film thickness and the lattice strain parameter c/a', regarding the Pt lower electrode manufactured by the sputtering film formation method. Although there is a variation as the film thickness of the Pt lower electrode is increased similarly as described above, it is found that c/a' is varied from 0.99865 to 0.9973, and is decreased almost monotonously. Reversely, it is found that a designed film thickness of Pt is set to be small, so that the Pt lower electrode is set in a non-strain state (c/a' to 1). Here, to 1" means that a value is almost equal to 1.

Based on this result, by controlling the film thickness of the Pt lower electrode having a close correlation with the lattice strain of the Pt lower electrode, so as to be 900 nm or less or so as to be 30% or less of the film thickness of the piezoelectric film, the piezoelectric properties of the lithium potassium sodium niobate, being a lead-free based piezoelectric film, can be improved.
(Control of the Lattice Strain by Heat Treatment after Film Formation of the Pt Electrode)

Figure 15:
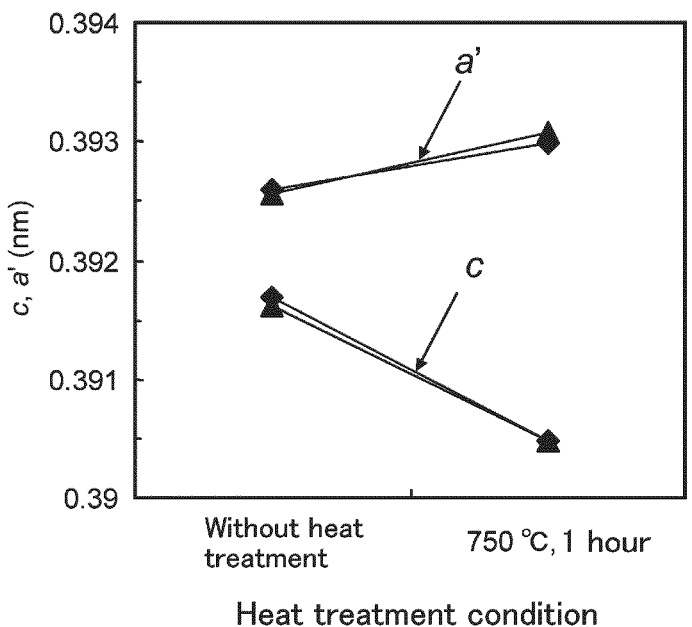
FIG. 15 is a comparison view of the lattice constants c and a' depending on presence/absence of a heat treatment of the Pt electrode formed by sputtering according to the example 3 of the present invention.

Further, as one of this example, control of the lattice strain was examined by heat treatment after film formation of the Pt lower electrode. As an example, FIG. 15 shows a difference between the lattice constant c in the normal line direction to the substrate surface, and the lattice constant a' parallel to the surface inclined to the substrate surface at about 10.47°, with respect to the substrate surface before/after heat treatment. In this example, the heat treatment was performed in the atmosphere at 750° C. for 1 hour. As shown in this figure, it is found that the lattice constant c of one of Pt is smaller from about 0.3916 to about 0.3905 by the heat treatment, and the other lattice constant a' is larger from about 0.3925 to about 0.3930.

Figure 16:
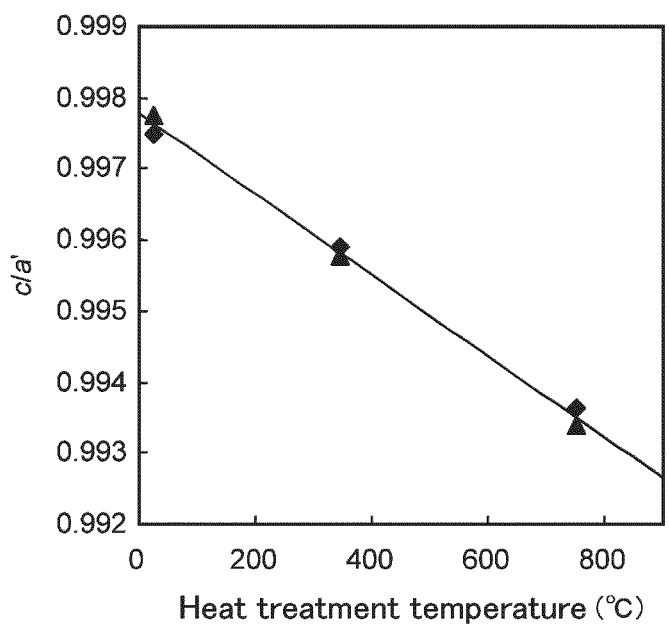
FIG. 16 is a correlation view between a heat treatment temperature of the Pt electrode formed by sputtering, and the lattice constants c and a' according to the example 3 of the present invention.

Namely, the lattice strain of the Pt lower electrode can be controlled by the heat treatment. Based on this result, examination was performed regarding the lattice strain of the Pt lower electrode at a temperature of the heat treatment. FIG. 16 shows a variation of the lattice strain parameter c/a', with respect to the temperature of the heat treatment. It is found that c/a' is decreased from about 0.9976 to about 0.9935, as the temperature of the heat treatment is set to be higher in a range of 20° C., 350° C., and 750° C. This means that when the temperature of the heat treatment is higher, a' becomes larger than c, and the lattice spacing a' almost parallel to the substrate surface is extended, and the Pt lower electrode is set in a tensile stress state.

Thus, by setting the heat treatment temperature higher after film formation, the tensile stress state of the Pt lower electrode is realized. However, in addition to the temperature of the heat treatment, by setting a sputtering charge electric power to be low, or setting a sputtering operation gas pressure (such as Ar gas pressure) to be low, the tensile stress state of the Pt lower electrode can be realized.

Example 4

(c/a' Dependence of the Piezoelectric Constant)

In example 4, the piezoelectric film element was manufactured, and the variation of the lattice strain parameter c/a' of the piezoelectric property was examined.

Figure 21:
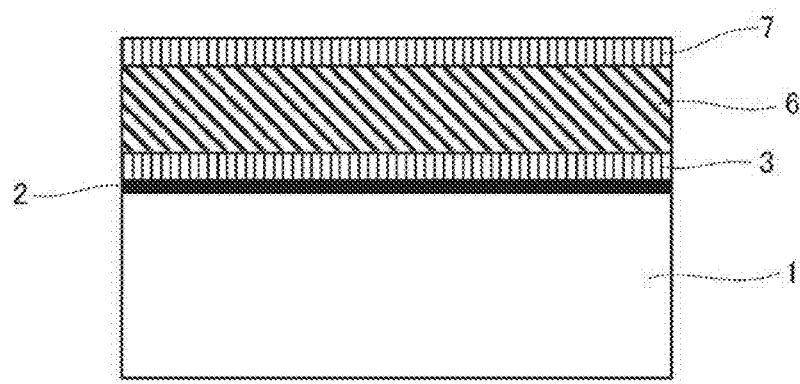
FIG. 21 is a cross-sectional view of the piezoelectric film element using a KNN piezoelectric film according to the example 4 of the present invention.

FIG. 21 shows a schematic cross-sectional structure of the piezoelectric film element according to example 4. This piezoelectric film element is formed based on the manufacturing condition of the example 1, wherein Pt upper electrode 7 is further formed on KNN piezoelectric film 6 of a substrate with the piezoelectric film (FIG. 5) manufactured by controlling c/a' by the aforementioned method.

Next, a manufacturing method of the Pt upper electrode 7 will be described.

The Pt upper electrode 7 (film thickness 20 nm) was further formed on the KNN piezoelectric film 6 by an RF magnetron sputtering method. The Pt upper electrode 7 was formed without heating the substrate, under conditions of discharge power: 200 W, introduction gas: Ar, pressure: 2.5 Pa, and film formation time: 1 minute.

Figure 17:
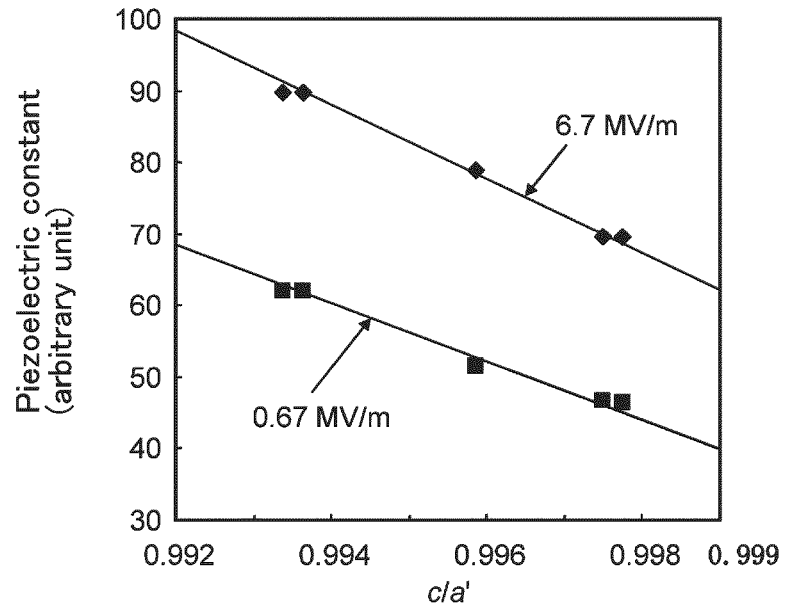
FIG. 17 is a correlation view between the lattice strain parameter c/a' of the Pt electrode and the piezoelectric constants in a piezoelectric element using a Pt lower electrode according to example 4 of the present invention.

FIG. 17 shows the variation of the piezoelectric properties (piezoelectric constant curve) of the piezoelectric film element of the example 4 manufacture as described above, with respect to c/a' of the Pt lower electrode. The horizontal axis shows the lattice strain parameter c/a' of the Pt electrode, and the vertical axis shows the piezoelectric constant. Here, as an example, the piezoelectric constant is shown at the time of applying an electric field of 6.7 MV/m or 0.67 MV/m between the upper electrode and the lower electrode.

Note that the unit of the piezoelectric constant is an arbitrary unit. Numerical values of Young modulus and Poisson's ratio are necessary for obtaining the piezoelectric constant. However, it is not easy to obtain the numerical values of the Young modulus and the Poisson's ratio of the piezoelectric film. Particularly, in a case of the thin film, it is not easy to principally obtain the absolute values (true values) of the Young modulus and the Poisson's ratio (constant) of the thin film itself, because an influence from a used substrate (restriction in substrate) is received during film formation, unlike the bulk body. Therefore, the piezoelectric constant was calculated by using estimated values of the Young modulus and the Poisson's ratio of the KNN film which have been known heretofore. Accordingly, the obtained piezoelectric constant value is an estimated value, and therefore it is set as a relative arbitrary value from the viewpoint of objectivity. However, although the values of the Young modulus and the Poisson's ratio used in calculating the piezoelectric constant are estimated values, they are reliable values to some degree, and about 80 (arbitrary unit) of the piezoelectric constant is approximately a value meaning that piezoelectric constant $d_{31}$ is 80 (-pm/V).

As shown in FIG. 17, it is found that the piezoelectric constant is monotonously increased, as the value of the lattice strain parameter c/a' of the Pt lower electrode is decreased from 0.9979 to 0.9935, in a range of 0.993 to 0.998. The piezoelectric constant is increased from about 70 to about 90 when an applied electric field is 6.7 MV/m, and the piezoelectric constant is increased from about 47 to 62, as c/a' is decreased, when the applied electric field is lowered by 1 digit to 0.67 MV/m. Namely, the same correlation is shown, irrespective of a magnitude of the electric field applied to the piezoelectric element. Thus, since the piezoelectric constant is monotonously changed with respect to c/a', an atomic level structure of an electrode material can be controlled and managed quantitatively with good precision for the first time.

Further, in order to make confirmation such that the piezoelectric constant is increased, with a decrease of c/a', irrespective of the magnitude of the applied electric field, even around 0.998 where c/a' is close to 1 which is not measured in FIG. 17, the variation of the piezoelectric properties of the KNN piezoelectric film element was examined in detail, in a range of c/a' (0.9979<c/a'<0.9985) which is narrower than a case of the aforementioned FIG. 17.

Figure 18:
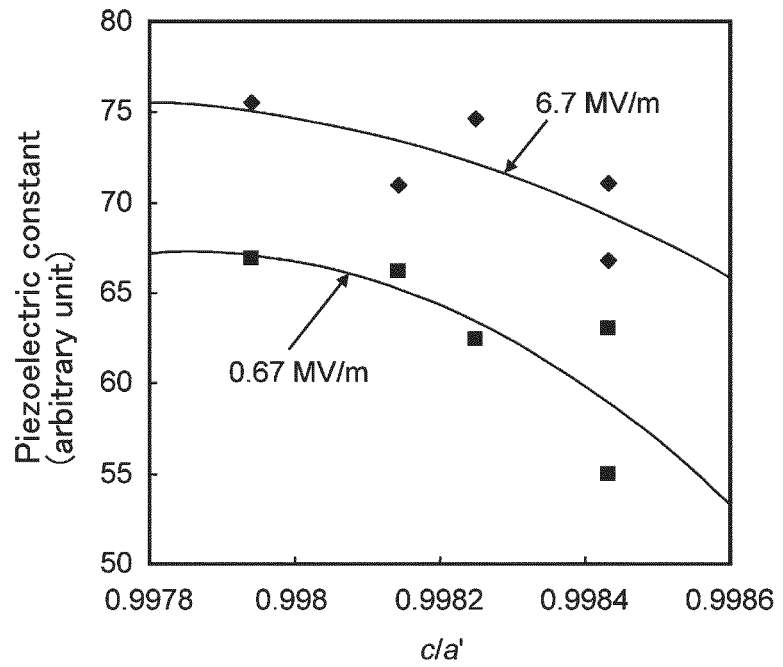
FIG. 18 is a correlation view between the lattice strain parameter c/a' which is set in a range between 0.9978 and 0.9986, and the piezoelectric constant, regarding the Pt electrode in the piezoelectric element using the Pt lower electrode according to the example 4 of the present invention.

FIG. 18 shows a correlation characteristic view thereof. Although there is a variation in a measurement results, similarly to FIG. 17, it is found that the piezoelectric constant is increased, with the decrease of c/a', irrespective of the magnitude of the applied electric field. Accordingly, by controlling the Pt lower electrode in a structure (tensile force) extending in the surface of the substrate, the piezoelectric properties of the KNN piezoelectric film element can be improved.

Further, in FIG. 17, a curve can be extrapolated precisely without problem, beyond an upper limit value 0.9979 and a lower limit value 0.9935 of data used in preparation of a piezoelectric constant curve. According to an extrapolation result shown in FIG. 17, it is found that the piezoelectric constant equivalent to a high piezoelectric constant (about 100) realized in PZT, can be realized, for example, by controlling the lattice strain parameter c/a' of the Pt lower electrode to be about 0.992 under the applied electric field of 6.7 MV/m.

Further, the piezoelectric constant 40 or more is realized by controlling the c/a' to be 0.999, under the applied electric field of 0.67 MV/m in a range that sufficiently allows the piezoelectric constant to be used as a purpose of use for a device.

Conventionally, it is said that the piezoelectric constant of the lead-based piezoelectric film PZT, which is said to have a high piezoelectric constant, is about 100. In a lead-free based piezoelectric film KNN of this example, as is clarified from the correlation of this example, by controlling the lattice strain parameter c/a' to be 0.992 or by controlling the internal stress to be about 1.104 GPa as the tensile force, it is found that the properties exceeding the piezoelectric constant of the conventional PZT thin film can be secured.

Figure 19:
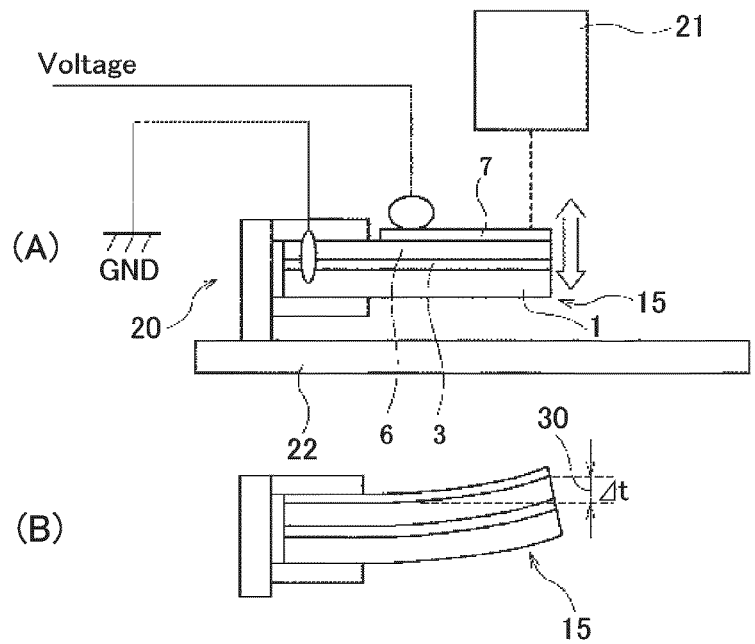
FIG. 19 is an explanatory view showing a method of a piezoelectric characteristic evaluation measurement according to the example 4 of the present invention.

The reliability of the piezoelectric film element obtained in this example 4 was examined. FIG. 19 is a view showing an outline of a unimorph cantilever 15 for evaluating and measuring the piezoelectric properties required for the examination. As shown in FIG. 19A, a rectangular beams (reed-shape) sample with length 20 mm×width 2.5 mm was cut out from the aforementioned piezoelectric film element, and a longitudinal end was fixed to a surface of a vibration-absorbing table 22 by a clamp 20 installed on the vibration-absorbing table 22, thereby forming a simple unimorph cantilever 15. By the vibration-absorbing table 22, an influence of a vibration on the unimorph cantilever 15 can be removed.

By applying a voltage to the KNN piezoelectric film 6 between the Pt upper and lower both electrodes 3 and 7 formed on the Si substrate 1, thereby extending and contracting the piezoelectric film 6, an overall unimorph cantilever 15 was operated to be bent as shown in FIG. 19B, thus operating the tip end of the unimorph cantilever 15. Maximum displacement amount 30 (Δt) of its tip end was measured by a laser Doppler displacement meter 21. Then, piezoelectric constant d31 was calculated from a relation among an application voltage obtained as a result, tip end maximum displacement amount 30 (called a piezoelectric displacement hereafter), and a dimension of the sample.

Figure 20:
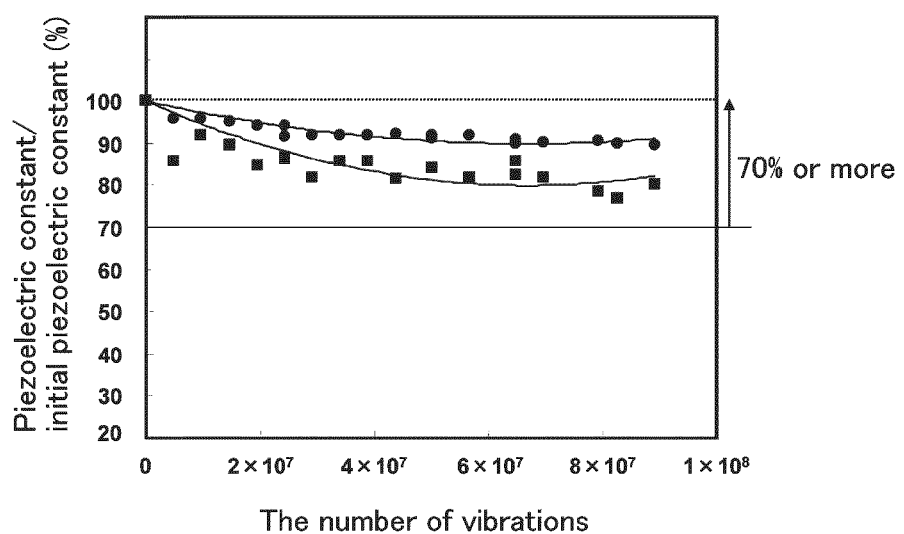
FIG. 20 is an explanatory view showing a reliability evaluation result of the piezoelectric film element according to the example 4 of the present invention.

Thus, when the unimorph cantilever was manufactured and the reliability of the piezoelectric film element was evaluated, it was found that as shown in FIG. 20, the piezoelectric film element with long service life and high reliability could be obtained, in which the piezoelectric constant after operation of one hundred million number of times ($1 \times 10^8$) was 70% of an initial piezoelectric constant.

As a comparative example, when the piezoelectric film element was manufactured so that c/a' was 0.990 and similarly the reliability was evaluated, it was found that the piezoelectric constant after one hundred million number of times was below initial 70%.

Further, in order to improve the reliability of the piezoelectric film element, a surface roughness of the Pt lower electrode was examined. Regarding the surface roughness of the Pt lower electrode, different root mean square roughness Rms and arithmetic mean roughness Ra are set, like (1.1 nm, 0.8 nm), (0.8 nm, 0.6 nm), (1.1 nm, 0.9 nm), (1.5 nm, 1.2 nm), and (2.5 nm, 2.0 nm), and five piezoelectric film element samples having such different Rms and Ra were manufactured, to perform piezoelectric operation. The applied electric fields to the KNN film were set as three kinds, such as 6.7 MV/m, 3.3 MV/m, and 0.6 MV/m. Results thereof are shown in table 1. In table 1, in a reliability test, the number of times of the piezoelectric operation is increased by one more digit and the piezoelectric constant after piezoelectric operation of billion number of times which is 70% or less of the initial piezoelectric constant is expressed by "x", and which is 70% or more is expressed by "o". From table 1, it was found that in the piezoelectric film element with Rms set to 1.1 nm or less, and Ra set to 0.9 nm or less, operation of billion number of times was achieved. Namely, not only by controlling the lattice strain of the Pt lower electrode but also controlling the surface roughness to improve a surface smoothness, the piezoelectric film element device with further long service life and high reliability could be provided.

TABLE 1

| Pt lower electrode Surface roughness (nm) | Rms | 1.1 | 0.8 | 1.1 | 1.5 | 2.5 |
|---|---|---|---|---|---|---|
| | Ra | 0.8 | 0.6 | 0.9 | 1.2 | 2.0 |
| Initial piezoelectric constant (arbitrary unit) | Electric field: 6.7 MV/m | 72.5 | 74.6 | 66.8 | 66.4 | 51.0 |
| | Electric field: 3.3 MV/m | 69.8 | 68.6 | 61.8 | 59.4 | 42.1 |
| | Electric field: 0.67 MV/m | 66.2 | 62.4 | 55.0 | 52.1 | 33.4 |
| Reliability | Electric field: 6.7 MV/m | o | o | o | x | x |
| | Electric field: 3.3 MV/m | o | o | o | x | x |
| | Electric field: 0.67 MV/m | o | o | o | x | x | o: Piezoelectric constant after operation of billion number of times/initial piezoelectric constant is 70% or more
x: Piezoelectric constant after operation of billion number of times/initial piezoelectric constant is less than 70%

<Additional Description>

Preferred aspects of the present invention will be additionally described.

According to an aspect of the present invention, a piezoelectric film element is provided, having on a substrate at least a lower electrode, a lead-free piezoelectric film, and an upper electrode, wherein at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and a ratio c/a' is set in a range of 0.992 or more and 0.999 or less, which is the ratio of a crystal lattice spacing c in a direction of a normal line to the substrate surface, with respect to a crystal lattice spacing a' whose inclination angle from the substrate surface is in a range of 10° or more and 30° or less.

In this case, preferably the piezoelectric film is expressed by a general formula $(Na_xK_yLi_z)NbO_3$ ($0 \leq x \leq 1$, $0 \leq y \leq 1$, $0 \leq z \leq 0.2$, $x+y+z=1$).

In this case, preferably the ratio c/a' of the lattice spacing falls within a range of 0.993 or more and 0.998 or less.

According to other aspect of the present invention, a piezoelectric film element is provided, having on a substrate at least a lower electrode, a lead-free piezoelectric film, and an upper electrode, wherein at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and an internal stress $\sigma_\phi$ is set in a range of 0.137 GPa or more and 1.104 GPa or less, which is obtained from the ratio c/a' of a crystal lattice spacing c in a direction of a normal line to the substrate surface, with respect to a crystal lattice spacing a' whose inclination angle from the substrate surface is in a range of 10° or more and 30° or less.

In this case, preferably the piezoelectric film is expressed by a general formula $(Na_xK_yLi_z)NbO_3$ ($0 \leq x \leq 1$, $0 \leq y \leq 1$, $0 \leq z \leq 0.2$, $x+y+z=1$).

In this case, preferably the internal stress $\sigma_\phi$ falls within a range of 0.274 GPa or more and 0.965 GPa or less.

Further, preferably at least the lower electrode out of the lower electrode and the upper electrode has a texture of fine crystal grains each having a columnar structure.

Further, preferably at least the lower electrode out of the lower electrode and the upper electrode has a composition of crystal grains with (001) preferential orientation, crystal grains with (110) preferential orientation, and crystal particles with preferential orientation, in which one of these oriented crystal grains exists or two or more of them coexist.

Further, preferably at least the lower electrode out of the lower electrode and the upper electrode has a strain in a state of a tensile stress in a parallel direction to the substrate surface.

Further, preferably at least the lower electrode out of the lower electrode and the upper electrode is set in a non-strain state having no internal stress.

Further, preferably at least the lower electrode out of the lower electrode and the upper electrode has a non-uniform strain in a vertical direction, parallel direction, or both directions to the substrate surface.

Further preferably at least the lower electrode out of the lower electrode and the upper electrode is an electrode layer made of Pt or an alloy mainly composed of Pt, or the electrode layer of a lamination structure including an electrode layer mainly composed of Pt.

Further, preferably the lower electrode layer is a single layer made of Ru, Ir, Sn, In, and an oxide of each of them, and a compound of them and an element contained in the piezoelectric film, or a laminate including these layers.

Further, preferably the upper electrode is an electrode layer made of Pt or an alloy mainly composed of Pt, or the electrode layer of a lamination structure including the electrode layer mainly composed of Pt.

Further, preferably the lower and upper electrode layers are layers made of Ru, Ir, Sn, In, and an oxide of each of them, and a compound of them and an element contained in the piezoelectric film, or a laminate including these layers.

Further, preferably at least the lower electrode out of the lower electrode and the upper electrode is a single layer or an electrode layer with a lamination structure.

Further, inexpensive Si substrate is industrially proved and is preferable. However, in addition to the Si substrate, MgO substrate, ZnO substrate, $SrTiO_3$ substrate, $SrRuO_3$ substrate, glass substrate, quartz glass substrate, GaAs substrate, GaN substrate, sapphire substrate, Ge substrate, or stainless substrate may be used.

Further, according to other aspect of the present invention, a piezoelectric film device is provided, comprising: the piezoelectric film element, a piezoelectric application part or a voltage detection part.

Further, according to other aspect of the present invention, a manufacturing method of a piezoelectric film element is provided, comprising the steps of:

forming on a substrate at least
a lower electrode;
a lead-free piezoelectric film; and
an upper electrode, respectively by sputtering, wherein film formation is performed so that at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and by controlling any one of or two or more of a film formation temperature, film thickness of an electrode film, or a heat treatment temperature after film formation, a ratio c/a' is set in a range of 0.992 or more and 0.999 or less, which is the ratio of a crystal lattice spacing c in a direction of a normal line to the substrate surface, with respect to a crystal lattice spacing a' whose inclination angle from the substrate surface is in a range of 10° or more and 30° or less.

In this case, preferably the piezoelectric film is expressed by a general formula $(Na_xK_yLi_z)NbO_3$ ($0 \leq x \leq 1$, $0 \leq y \leq 1$, $0 \leq z \leq 0.2$, $x+y+z=1$).

In this case, preferably the ratio c/a' of the lattice spacing a' falls within a range of 0.993 or more and 0.998 or less.

According to other aspect of the present invention, a manufacturing method of a piezoelectric film element is provided, comprising the steps of:

forming on a substrate at least:
a lower electrode;
a lead-free piezoelectric film, and
an upper electrode, respectively by sputtering, and
evaluating at least the lower electrode out of the lower electrode and the upper electrode, by measuring a lattice spacing c in a direction of a normal line to the substrate surface, and lattice spacing a' whose inclination angle from the substrate surface is in a range of 10° or more and 40° or less.

In this case, preferably the piezoelectric film is expressed by a general formula $(Na_xK_yLi_z)NbO_3$ ($0 \leq x \leq 1$, $0 \leq y \leq 1$, $0 \leq z \leq 0.2$, $x+y+z=1$).

In this case, preferably the lower electrode is evaluated by measuring the lattice spacing a' whose inclination angle from the substrate surface is in a range of 10° or more and 30° or less.

Further, preferably there is a step of evaluating the lower electrode by measuring the ratio c/a' of the lattice spacing c to the lattice spacing a'.

Further, in addition to a lattice control of the c/a', preferably surface roughness Rms of the Pt lower electrode is set to be 1.1 nm or less and Ra of the Pt lower electrode is set to be 0.9 nm or less.

The present application is based on Japanese Patent Application No. 2010-020922, filed on Feb. 2, 2010, the entire contents of which are hereby incorporated by reference.

What is claimed is:

1. A piezoelectric film element, having on a substrate, at least a lower electrode, a lead-free piezoelectric film, and an upper electrode, wherein at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and a ratio c/a' is set in a range of 0.992 or more and 0.999 or less, which is the ratio of a crystal lattice spacing c in a direction of a normal line to the substrate surface, with respect to a crystal lattice spacing a' whose inclination angle from the substrate surface is in a range of 10° or more and 30° or less.

2. The piezoelectric film element according to claim 1, wherein the piezoelectric film is expressed by a general formula $(Na_xK_yLi_z)NbO_3$ ($0 \leq x \leq 1$, $0 \leq y \leq 1$, $0 \leq z \leq 0.2$, $x+y+z=1$).

3. The piezoelectric film element according to claim 1, wherein the ratio c/a' of the lattice spacing is in a range of 0.993 or more and 0.998 or less.

4. The piezoelectric film element according to claim 1, wherein at least the lower electrode out of the lower electrode and the upper electrode has a texture of fine crystal grains each having a columnar structure.

5. The piezoelectric film element according to claim 1, wherein at least the lower electrode out of the lower electrode and the upper electrode has a composition of crystal grains with (001) preferential orientation, crystal grains with (110) preferential orientation, and crystal grains with (111) preferential orientation, in which one of these oriented crystals exists or two or more of them coexist.

6. The piezoelectric film element according to claim 1, wherein at least the lower electrode out of the lower electrode and the upper electrode has a strain in a state of a tensile stress in a parallel direction to the substrate surface.

7. The piezoelectric film element according to claim 1 4,wherein at least the lower electrode out of the lower electrode and the upper electrode is an electrode layer made of Pt or an alloy mainly composed of Pt, or the electrode layer of a lamination structure including an electrode layer mainly composed of Pt.

8. The piezoelectric film element according to claim 1, wherein the substrate is Si substrate.

9. A piezoelectric film device, comprising:
the piezoelectric film element according to claim 1, a function generator or a voltage detection part.

10. A piezoelectric film element, having on a substrate at least a lower electrode, a lead-free piezoelectric film, and an upper electrode, wherein at least the lower electrode out of the lower electrode and the upper electrode has a crystal structure of a cubic crystal system, a tetragonal crystal system, an orthorhombic crystal system, a hexagonal crystal system, a monoclinic crystal system, a triclinic crystal system, a trigonal crystal system, or has a composition in which one of these crystals exists or two or more of them coexist, and crystal axes of the crystal structure are preferentially oriented to a specific axis smaller than or equal to two axes of these crystals, and an internal stress $\sigma_\phi$ is set in a range of 0.137 GPa or more and 1.104 GPa or less, which is obtained from the ratio c/a' of a crystal lattice spacing c in a direction of a normal line to the substrate surface, with respect to a crystal lattice spacing a' whose inclination angle from the substrate surface is in a range of 10° or more and 30° or less.

11. The piezoelectric film element according to claim 10, wherein the piezoelectric film is expressed by a general formula $(Na_xK_yLi_z)NbO_3$ (0≤x≤1, 0≤y≤1, 0≤z ≤0.2, x+y+z=1).

12. The piezoelectric film element according to claim 10, wherein the internal stress $\sigma_{100}$ is in a range of 0.274 GPa or more and 0.965 or less.

13. The piezoelectric film element according to claim 10, wherein at least the lower electrode out of the lower electrode and the upper electrode has a texture of fine crystal grains each having a columnar structure.

14. The piezoelectric film element according to claim 10, wherein at least the lower electrode out of the lower electrode and the upper electrode has a composition of crystal grains with (001) preferential orientation, crystal grains with (110) preferential orientation, and crystal grains with (111) preferential orientation, in which one of these oriented crystals exists or two or more of them coexist.

15. The piezoelectric film element according to claim 10, wherein at least the lower electrode out of the lower electrode and the upper electrode has a strain in a state of a tensile stress in a parallel direction to the substrate surface.

16. The piezoelectric film element according to claim 10, wherein at least the lower electrode out of the lower electrode and the upper electrode is an electrode layer made of Pt or an alloy mainly composed of Pt, or the electrode layer of a lamination structure including an electrode layer mainly composed of Pt.

17. The piezoelectric film element according to claim 10, wherein the substrate is Si substrate.

18. A piezoelectric film device, comprising:
the piezoelectric film element according to claim 10, a function generator or a voltage detection part.

* * * * *